(12) United States Patent
Oohashi et al.

(10) Patent No.: US 7,599,754 B2
(45) Date of Patent: Oct. 6, 2009

(54) METHOD AND SYSTEM FOR DESIGNING A POWER CONVERTER

(75) Inventors: Hiromichi Oohashi, Tsukuba (JP); Kazuto Takao, Tsukuba (JP); Yuusuke Hayashi, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 213 days.

(21) Appl. No.: 11/757,675

(22) Filed: Jun. 4, 2007

(65) Prior Publication Data

US 2007/0282473 A1    Dec. 6, 2007

(30) Foreign Application Priority Data

Jun. 5, 2006  (JP) .............................. 2006-155651
Jun. 5, 2006  (JP) .............................. 2006-155817

(51) Int. Cl.
G06F 19/00    (2006.01)
H02M 1/00    (2007.01)

(52) U.S. Cl. ......................................... 700/97; 363/147

(58) Field of Classification Search ................... 363/50, 363/52, 55, 144, 147; 29/702, 703, 729; 700/97, 103, 106, 108
See application file for complete search history.

(56) References Cited

U.S. PATENT DOCUMENTS 5,777,841 A * 7/1998 Stone et al. ................. 702/118
5,946,210 A * 8/1999 Montminy et al. ............ 700/97
7,433,214 B2 * 10/2008 Kunow et al. ................ 363/65

FOREIGN PATENT DOCUMENTS

JP    2001-275340    10/2001

OTHER PUBLICATIONS

Zhenxian Liang et al.; Integrated CoolMOS FET/SiC-Diode Module for High Performance Power Switching; IEEE Transactions on Power Electronics, vol. 20, No. 3, May 2005.
Alexander Lidow et al.; The Semiconductor Roadmap for Power Management in the New Millennium; Proceedings of the IEEE, vol. 89, No. 6, Jun. 2001.
Hirofumi Itokawa et al.; "Power Loss Limit Analysis Method for High Output-Power Density Converters by a Pair of Si-MOSFET with SiC-SBD"; The Paper of Joint Technical Meeting on Election Devices and Semiconductor Power Converter, IEE Japan, vol. EDD-05 No. 45-51, pp. 9-14, Oct. 27, 2005.

* cited by examiner

Primary Examiner—Matthew V Nguyen
(74) Attorney, Agent, or Firm—McGlew and Tuttle, P.C.

(57) ABSTRACT

After specifications of a power converter are determined, circuit parameter values, a semiconductor device to be used, and an equivalent circuit of the semiconductor device are determined, and parameter values of the equivalent circuit are extracted. Semiconductor device loss is calculated from semiconductor device equivalent circuit parameter data, circuit parasitic parameter data, and circuit basic parameters. Determination as to whether or not the circuit loss optimal value has been achieved is made in consideration of power conversion circuit component parameter data. When the optimal value has not been achieved, the circuit parasitic parameter values are set again so as to create the circuit parasitic parameter data. When the optimal value has been achieved, the semiconductor device loss and the circuit parasitic parameter values at that time are output as design data, and the power converter is designed by use of the optimized semiconductor device loss and circuit parasitic parameter values.

30 Claims, 34 Drawing Sheets

- PARASITIC INDUCTANCE : 17 nH
- PARASITIC CAPACITANCE : 32 pF

METHOD AND SYSTEM FOR DESIGNING A POWER CONVERTER

BACKGROUND OF THE INVENTION

1. Field of the Invention

The present invention relates to a method, a system, and a program for designing a power converter. In particular, the present invention relates to a semiconductor-device-loss designing method necessary for a design which increases the output power densities of power converters.

2. Description of the Related Art

Modern society depends on the premise that electrical power can be converted to a voltage, current, frequency, and phase suitable for use thereof, and electrical power can be freely used anywhere and anytime in any field of the society. Therefore, power converters, such as inverters, are used in a wide range of fields; for example, in information and telecommunication equipment, home appliances, industrial equipment, electrical railroads, power distribution systems, and power systems. With progress of power converter technologies, power converters have been reduced in size and weight. In association of this trend, the output power densities of power converters have been increased one-hundred hold or more in the past 30 years, and at present, an output power density of 5 W/cm$^3$ is realized. Increasing the output power density will become more and more important in the future. The output power densities of power converters, which are used in power supplies of information and telecommunication systems, electric vehicles, and distributed power supplies of wind power generation systems and photovoltaic power generation systems, are considered to increase more and more.

In order to increase the output power density of a power converter, the volume of the converter must be reduced without lowering output power. Main components which determine the volume of a converter are a cooling unit and a filter. In order to reduce the volume of the cooling unit, it is important to perform thermal design in consideration of losses of semiconductor devices and a filter used in the power converter. Further, in order to reduce the volume of the filter, which is composed of an inductor and a capacitor, the switching frequency of the semiconductor devices must be increased.

An increase in the power density of a power converter is achieved through reduction of its volume. This volume reduction has been achieved by two fundamental methods; i.e., (1) reducing loss of a power converter to thereby reduce the volume of a cooling unit, and (2) increasing switching frequency to thereby reduce the volume of passive components such as an LC filter.

In order to reduce loss and simultaneously increase switching frequency, switching loss generated as a result of switching of semiconductor devices must be reduced. For such a purpose, the switching time must be shortened; that is, voltage change rate dv/dt and current change rate di/dt at the time of switching must be increased.

In order to reduce the sizes of a cooling unit and passive components to a theoretical limit while securing required functions of a power converter, loss of semiconductor devices, which becomes necessary when these unit and components are designed, must be accurately designed. Parameters associated with the main circuit of a power converter include true circuit parameters such as resistance R, inductance L, and capacitance C, which are provided so as to realize a predetermined circuit operation, and extrinsic circuit parameters such as parasitic inductance Ls and parasitic capacitance Cs, which are naturally generated in association with realizing a wiring structure that constitutes the main circuit. At time of switching, induced voltage Ls·di/dt stemming from the parasitic inductance Ls and displacement current Cs·dv/dt stemming from the parasitic capacitance Cs affect the voltage applied to the switched semiconductor devices and current flowing therethrough. Consequently, the parasitic inductance and the parasitic capacitance influence the loss of the semiconductor devices.

Accordingly, an accurate semiconductor-device-loss design method in which the influence of parasitic inductances and parasitic capacitances on the loss of semiconductor devices are taken into consideration is needed for design of a power converter of high power density. In a conventionally known semiconductor-device-loss design method, voltage applied to a semiconductor device and current flowing therethrough are calculated by use of a circuit simulator, and the product thereof is integrated with respect to time so as to calculate the loss of the semiconductor device (see Non-Patent Document 1).

However, in the circuit simulator, a semiconductor device is represented in the form of an equivalent circuit by use of electrical circuit elements such as a voltage source, a current source, an inductor, a capacitor, a resistor, etc. Therefore, the switching behavior of a semiconductor device, which is determined by non-linear semiconductor device parameters, and interaction between the semiconductor device parameters and the parasitic inductance and parasitic capacitance of the circuit cannot be represented completely on the simulator. Accordingly, accurately and quantitatively designing the loss of the semiconductor device is difficult.

In the method of calculating the loss by integrating the product of voltage and current at the time of switching, the loss cannot be separated to a component attributable to the semiconductor device and a component attributable to circuit parasitic parameters. Since the ratio of the loss attributable to the circuit parasitic parameters to the entire loss cannot be known, difficulty encounters in designing the circuit parasitic parameters which minimize the semiconductor device loss.

The loss of a power converter mainly consists of semiconductor device loss (about 60%), filter loss (about 30%), and other losses (about 10%) (see Non-Patent Document 2). In the conventional thermal design method for power converters, only thermal design for semiconductor devices whose loss accounts for a large portion of the entire loss is performed, and comprehensive thermal design in which filter loss and other losses are taken into consideration is not performed.

Parameters of the main circuit of a power converter include true circuit parameters such as resistance R, inductance L, and capacitance C, which are provided so as to realize a predetermined circuit operation, and extrinsic circuit parameters such as parasitic inductance Ls and parasitic capacitance Cs, which are naturally generated in association with realizing a wiring structure that constitutes the main circuit. In conventional power converters which are driven at a relatively low switching frequency of several kHz to several 10 kHz, the loss produced as a result of energy being charged into the parasitic inductance Ls and the parasitic capacitance Cs and discharged therefrom is small as compared with the loss of semiconductor devices and a filter, and therefore has been ignored.

Further, in conventional noise design for power converters which are driven at a relatively low switching frequency of several kHz to several 10 kHz, noise design is performed only for the switching frequency determined by the control system, and resonance frequency components generated by the parasitic inductance Ls and the parasitic capacitance Cs, which are extrinsic parameters associated with the main circuit of the converter, and deterioration of filter frequency characteristics attributable to a parasitic inductance Lfs and a parasitic capacitance Cfs, which are naturally generated when the wiring structure of the filter is realized, have been ignored.

FIG. 34 is a flowchart showing a typical conventional power converter design method. The conventional power converter design method is performed as follows.

In Step 1 for determination of target specifications, a rated capacity, a rated voltage, a rated current, a target efficiency, and a target power density of the power converter are determined.

In Step 2 for designing devices and the main circuit, a device which satisfies the rated voltage and current of the power converter is selected, and an on-resistance Ron, which is a semiconductor device parameter that determines conduction loss, is determined through (1) use of a data sheet of the semiconductor device or (2) measurement.

The on resistance Ron of the semiconductor device is substituted in the following Eq. (1) to thereby calculate the conduction loss Pcond.

$$P_{COND} = \frac{V t I_d}{\pi \sqrt{2}} \left[1 + \frac{1}{4} k \cos\phi \right] + \frac{R_{ON} I_d^2}{2\pi} \left[\frac{\pi}{2} + \frac{4}{3} k \cos\phi \right] \quad (1)$$

In Eq. (1), Vt represents the threshold voltage of the semiconductor device, and I represents the rms value of current flowing from the power converter to a load. k represents an amplitude modulation ratio used for controlling the amplitude of output voltage of the power converter, and cosϕ represents the power factor of the load.

Further, turn-on switching energy $E_{ON}$(Iave) and turn-off switching energy $E_{OFF}$(Iave) are experimentally. Iave represents the average value of current flowing through the semiconductor device, and can be given by the following equation by use of load current RMS value $I_{RMS}$ obtained from the target specifications.

$$I_{ave} = \frac{2}{\pi} \sqrt{2} \, I_{RMS} \quad (2)$$

Next, in Step 3 for control/drive design, a switching frequency $f_{SW}$ and a switching pattern are determined as operation conditions for driving the power converter. The switching loss $P_{SW}$ of the semiconductor device is then obtained by use of the following equation.

$$P_{SW} = \frac{f_{SW}}{2} [E_{Ton}(I_{ave}) + E_{Toff}(I_{ave})] \quad (3)$$

The total loss of the semiconductor device is calculated by adding the above-described conduction loss $P_{COND}$ and the switching loss $P_{SW}$.

Next, in Step 4 for filter design, a filter inductance Lf and a filter capacitance Cf for removing harmonics of the switching frequency component from the output waveform of the converter are determined. The filter attenuation characteristic is determined from the filter inductance and the filter capacitance, which are generally set so that the attenuation factor becomes ⅕ to 1/10 at the switching frequency.

In Step 5, the power converter is manufactured on a trial basis by use of the results obtained in the above-described steps.

In Step 6, the target specifications of the power converter manufactured in Step 5 (e.g., conversion efficiency, power density, and temperature of the semiconductor device) are experimentally measured.

In Step 7, the specifications of the manufactured power converter are compared with the target specifications. If the target specifications are attained, the designing procedure is ended. If the target specifications are not attained, analysis and determination of adjustment parameters are performed in Step 8.

In Step 8 for analysis and determination of adjustment parameters, parameters which must be adjusted so as to attain the target specifications are determined. If the temperature of the semiconductor device is higher than an allowable operating temperature obtained from the data sheet, Step 2 for device/main circuit design or Step 3 for filter design is executed again. If the harmonics of the switching frequency component contained in the converter output waveform do not meet the specifications, Step 4 for filter design is executed again.

In small-sized, lightweight power converters of large output power density, such as CPU power supplies, power supplies for information and telecommunication systems such as data centers, and motor drivers of hybrid vehicles and fuel-cell vehicles, which are expected to grow in the future, super-low-loss semiconductor devices which can be switched at high speed will be used. In such a power converter having a high output power density, there must be considered the influence of extrinsic parameters such as parasitic inductance and parasitic capacitance on the losses of the semiconductor device and the filter, along with the required frequency characteristic. However, the conventional power converter design method having been described with reference to FIG. 34 cannot cope with such a problem.

In future power converters having high output power density and driven through high speed switching, there cannot be ignored the influence of semiconductor device loss attributable to interaction with the parasitic inductance and the parasitic capacitance stemming from the structure of the semiconductor device and the wiring structure of the power converter, which influence has been ignored in the past. Therefore, accurate thermal design cannot be performed by the conventional method.

The filter loss attributable to the parasitic inductance and the parasitic capacitance, and the required frequency characteristic will become factors which cannot be ignored. When the operation speed and frequency of the power conversion circuit are increased, an increase is seen in the influence of the resonance frequency component produced by the parasitic inductance and the parasitic capacitance, which influence has conventionally not been taken in consideration when the frequency characteristic of the filter is designed. Therefore, it becomes necessary to design a filter wiring structure and a filter structure for eliminating not only the switching frequency component but also the resonance frequency component. Further, since an increase is seen in the ratio of loss of a passive filter, which conventionally has not be taken into consideration in the designing step, to the overall loss of the converter, in addition to a method of designing semiconductor device loss, a method of designing passive-filter loss becomes necessary.

As described above, in the conventional power converter design method, the influence of parasitic inductance and parasitic capacitance, which become marked as a result of an increase in operation speed and frequency, is not quantified, and the target specifications are attained through repetition of fine adjustment accompanied by trial manufacture and re-design. Therefore, when a power converter which operates at high speed and high frequency at which the influence of parasitic inductance and parasitic capacitance becomes remarkable is designed, a huge amount of time is required for trial manufacture and re-resign. Further, a converter cannot be optimally designed by the design method in which the target specifications are attained through repetition of trial manufacture and re-design.

[Non Patent Document 1] Z. Liang, B. Lu, J. D. van Wyk and F. C. Lee, IEEE trans. on Power Electronics, Vol. 20, No. 3(2005).

[Non Patent Document 2] A. Lidow, Proc. of IEEE, 89, 803(2001).

SUMMARY OF THE INVENTION

The present invention has been accomplished in view of the above-described problems in conventional design methods, and an object of the present invention is to provide a method of designing semiconductor device loss which is required for increasing the output power density of a power converter and in which the influence, on the semiconductor device loss, of non-linear semiconductor device parameters and parasitic inductance and parasitic capacitance stemming from a wiring structure are taken into consideration.

Another object of the present invention is to provide a comprehensive design method required for increasing the output power density of a power converter in which the influence of parasitic inductance and parasitic capacitance stemming from a semiconductor device structure and a wiring structure on the semiconductor device loss, filter loss, filter frequency characteristic, and control system is taken into consideration.

A method, system, and program for designing a power converter according to the present invention determine specifications of the power converter, including electrical specifications and a circuit configuration; determine circuit parameter values for realizing the electrical specifications and the circuit configuration; determine a semiconductor device which is used for realizing the electrical specifications and the circuit configuration; determine an equivalent circuit of the semiconductor device; and extract parameter values of the semiconductor device equivalent circuit as input data for calculating loss of the semiconductor device. The method, system, and program divide the circuit parameter values into circuit parasitic parameter data and circuit basic parameter data, which serve as input data for calculating the loss of the semiconductor device; and supply the semiconductor device equivalent circuit parameter data, the circuit parasitic parameter data, and the circuit basic parameter to a semiconductor device loss model so as to calculate the loss of the semiconductor device. The method, system, and program determine whether or not the circuit loss optimal value has been achieved in consideration of previously prepared parameter data of components of the power conversion circuit, including control parameter data and filter parameter data. When the circuit loss optimal value has not yet been achieved, the method, system, and program again set the circuit parasitic parameter values, and create the circuit parasitic parameter data. When the circuit loss optimal value has been achieved, the method, system, and program again output, as design data, the semiconductor device loss and the circuit parasitic parameter values at that time, and design the power converter by use of the optimized semiconductor device loss and circuit parasitic parameter values.

That is, in order to solve the above-described problems, the present invention employs the following means.

First means for representing, in the form of a theoretical equation, the energy (charge) accumulated in non-linear semiconductor device parameters.

Second means for representing, in the form of a theoretical equation, the energy accumulated in a parasitic inductance and a parasitic capacitance.

Third means for representing, in the form of a theoretical equation, the energy generated at time of switching, by use of semiconductor device parameters and circuit parameters, which determine the switching waveform.

Fourth means for creating a semiconductor device loss model through integration of the above-described three theoretical equations regarding energy, and for designing the switching loss of the semiconductor device by making use of the semiconductor device loss model.

Fifth means for calculating conduction loss by use of resistance of the semiconductor device, current flowing therethrough, and constants determined from the specifications of the power converter.

Sixth means for creating a numerical calculation program for calculating the loss of the semiconductor device by use of the above-described equations, and for calculating the loss by use of the program.

The present invention also provides a comprehensive design method for power converters in which attention is paid to the parasitic inductance and the parasitic capacitance, which greatly affect the semiconductor device loss, semiconductor device over-voltage, filter loss, and filter frequency characteristic; the interrelations between the semiconductor device loss, semiconductor device over-voltage, filter loss, and filter frequency characteristic, and parameters which are contained in two-body problems between control and the device, between the device and the filter, and between the control and the filter, are quantified; a converter comprehensive design database in which a plurality of quantified data sets are grouped while the parasitic inductance and the parasitic capacitance are used as parameters is created; and optimal parameters for meeting the target specifications of the power converter under the actual operation conditions are selected.

According such a power converter comprehensive design method, a design which can minimize the volumes of a cooling unit and a filter, which minimization is necessary for increasing output power density, can be performed through advance evaluation of the influence of extrinsic parameters on the total loss.

In the present invention, in connection with the structure design of the power converter, there is provided a technique for optimizing design coordination between extrinsic parameters and true parameters for expressing intrinsic characteristics of the semiconductor device and the filter. Moreover, the present invention enables virtual converter design to be performed at the beginning of the development of a power converter. Therefore, the development period can be shortened greatly, and the development efficiency can be improved.

According to the present invention, in the semiconductor device loss design, the influence of the non-linear parameters of the semiconductor device on the semiconductor device loss, and the influence of switching loss, parasitic inductance, and parasitic capacitance on the semiconductor device loss can be accurately taken into consideration, and therefore, the semiconductor device loss can be accurately designed. As a result, through application of the present invention, there can be realized many advantageous effects listed below, which have not been realized by conventional semiconductor device loss design methods.

(1) Since the semiconductor device loss can be separated into a component attributable to semiconductor device parameters and a component attributable to circuit parasitic parameters, the design coordination between the components is possible, whereby semiconductor device loss design which can make best use of characteristics of the semiconductor device becomes possible.

(2) Since the influence of the circuit parasitic parameters, which are generated in association with design of the wiring structure of the power converter, on the semiconductor device loss can be calculated quantitatively, optimal design of the power converter by means of coordinated design of the semiconductor device loss and the structure design necessary for increasing the output power density of the power converter becomes possible.

(3) Since the minimum value of the semiconductor device loss can be designed, a design for minimizing the volume of the cooling unit can be realized.

(4) The loss of a new-type semiconductor device in a research/development stage, which would be produced when the device is mounted on an actual power converter for practical use, can be accurately calculated, and virtual thermal design for the power converter can be accurately performed by use of the calculated loss. Therefore, problems involved in product development can be predicted in advance. Accordingly, problems associated with circuit and converter design can be fed back to development of semiconductor devices, whereby the efficiency of the research and development can be improved.

(5) Since virtual thermal design can be performed by making use of the designed value of the semiconductor device loss, the responsibilities of sections which share the work in the course of putting the power converter into practice can be predicted from the development stage of a new-type semiconductor device, whereby the development period can be shortened greatly, and efficient research and development becomes possible.

According to the present invention, in thermal design for a power converter, extrinsic parameters (parasitic parameters), such as parasitic inductance and parasitic capacitance, which have conventionally been ignored, and true circuit parameters and true semiconductor device parameters, which have been used in conventional design, are separated; and the influences of the true and extrinsic parameters on semiconductor device loss, filter loss, and filter frequency characteristic are calculated quantitatively. This enables comprehensive design of a power converter circuit which comprehensively realizes control design, device/main circuit design, and filter design while using extrinsic parameters as parameters. Thus, it becomes possible to easily perform optimal selection of extrinsic parameters necessary for realizing a compact, lightweight power converter of high output power density. As a result, through application of the present invention, many advantageous effects as described below, which have not been realized by conventional semiconductor device loss design methods, can be realized.

According to the present invention, the influences of true parameters and extrinsic parameters on semiconductor device loss and filter loss at the time when the power conversion circuit actually operates can be divided. Therefore, design coordination between these parameters and the intrinsic characteristics of the semiconductor device and the filter becomes possible, whereby thermal design and noise design which can maximally utilize the characteristics of the semiconductor device and the filter become possible.

According to the present invention, the thermal and electromagnetic influences, on the conversion circuit, of the extrinsic parameters generated in association with the wiring structure design of the power converter can be calculated quantitatively. Therefore, optimal design of the power converter by means of coordinated design of the characteristics of the semiconductor device and the filter and the structure design necessary for increasing the output power density of the power converter becomes possible.

According to the present invention, the loss of a new-type semiconductor device in a research/development stage, which would be produced when the device is mounted on an actual power converter at the time of future practical use of the device, can be accurately calculated, and virtual design for the power converter can be accurately performed. Therefore, problems involved in product development can be predicted in advance, and problems associated with circuit and converter design can be fed back to development of the control system, semiconductor device, and filter, whereby the efficiency of the research and development can be improved.

According to the present invention, the loss and noise attenuation characteristic of a new-type magnetic material for a filter in a research/development stage, which would be produced when the filter is mounted on an actual power converter at the time of future practical use of the material, can be accurately calculated, and virtual design for the power converter can be accurately performed. Therefore, problems involved in product development can be predicted in advance, and problems associated with circuit and converter design can be fed back to development of the control system, semiconductor device, and filter, whereby the efficiency of the research and development can be improved.

Moreover, according to the present invention, virtual thermal design of a converter becomes possible. Therefore, the responsibilities of sections which share the work in the course of putting the power converter into practice can be predicted from the development stage of a new-type semiconductor device or a new-type magnetic material, whereby the development period can be shortened greatly, and efficient research and development becomes possible.

As described above, the present invention can provide many advantageous effects, which have not been realized by conventional methods.

BRIEF DESCRIPTION OF THE DRAWINGS

FIG. 8 shows waveforms of gate-source voltage, drain current, and drain-source voltage of a MOSFET when it is turned on;

DETAILED DESCRIPTION OF THE PREFERRED EMBODIMENTS

The first embodiment of the present invention will now be described with reference to FIGS. 1 to 8.

Figure 1:
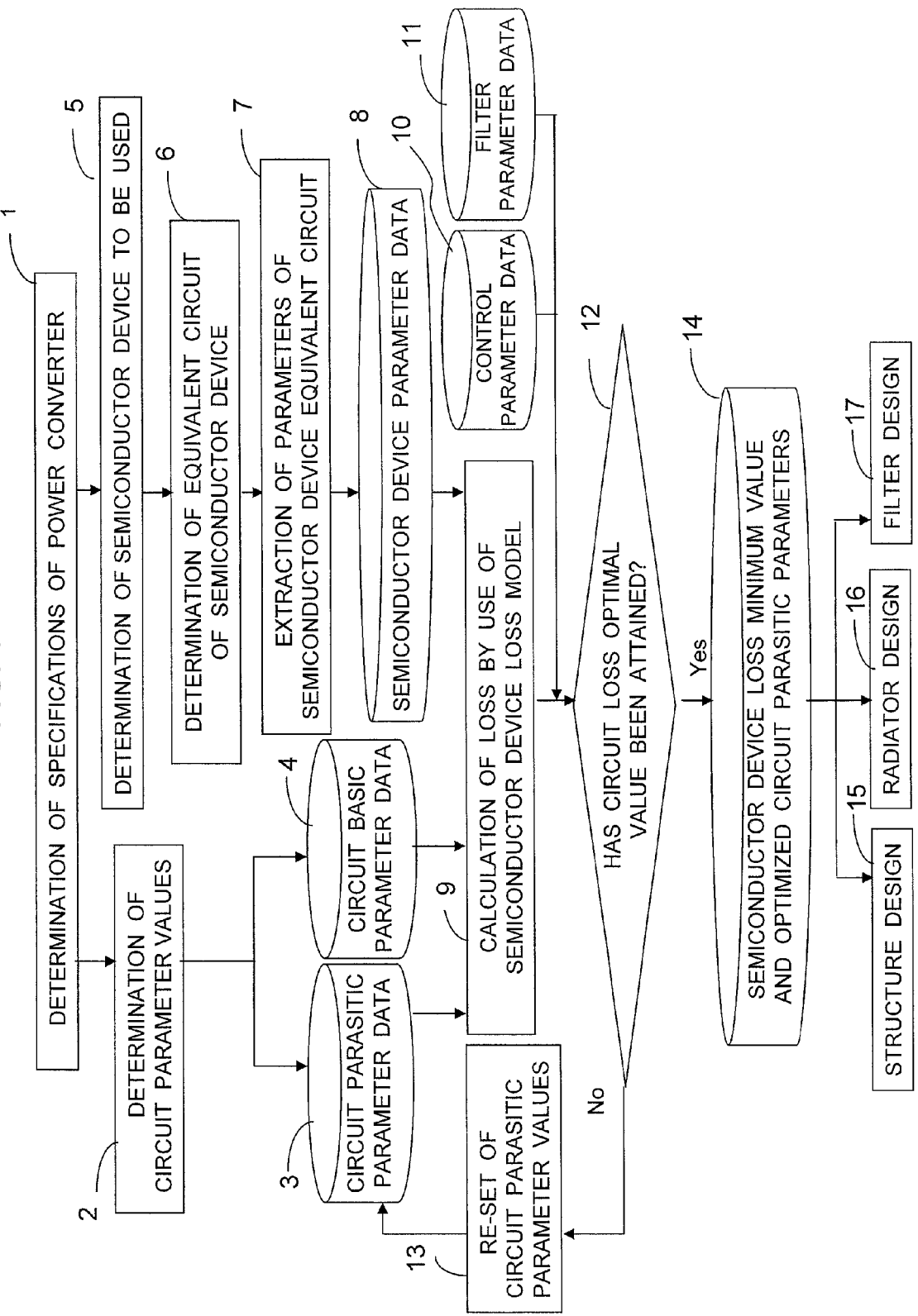
FIG. 1 is a flowchart showing a semiconductor device loss design method according to the present invention.

FIG. 1 is a flowchart showing a semiconductor device loss design method according to the present invention;

In Step 1 of FIG. 1, specifications of the power converter, such as electrical specifications and a circuit configuration, are determined. The term "power converter" encompass not only inverters for conversion from DC to AC, but also converters for conversion from AC to DC, converters for conversion from DC to DC, converters for conversion from AC to AC, etc. Next, in Step 2, circuit parameter values for realizing the specifications of the power converter determined in Step 1 are determined. Subsequently, in Step 3, circuit parasitic parameter data of the circuit parameter values determined in Step 2 are created. Next, in Step 4, circuit basic parameter data of the circuit parameter values determined in Step 2 are created.

Subsequently, in Step 5, a semiconductor device which is used for realizing the specifications of the power converter determined in Step 1 is determined. Next, in Step 6, an equivalent circuit of the semiconductor device determined in Step 5 is determined. Subsequently, in Step 7, parameters of the semiconductor device equivalent circuit determined in Step 6 are extracted. Next, in Step 8, the semiconductor device parameters extracted in Step 7 are stored in a data format suitable for use for calculation of semiconductor device loss. Subsequently, in Step 9, the circuit parasitic parameter data created in Step 3, the circuit basic parameter data created in Step 4, and the semiconductor device parameter data created in Step 8 are supplied to a semiconductor device loss model so as to calculate the loss of the semiconductor device. Next, in Step 12, determination as to whether or not the semiconductor device loss calculated in Step 9 has reached the optimal value is made in consideration of previously prepared component parameters of the power conversion circuit, such as control parameter data 10 and filter parameter data 11. When the semiconductor device loss has not yet reached the optimal value, the circuit parasitic parameter values are set again in Step 13, the reset values are inserted into the circuit parasitic parameter data 3, and subsequent steps are performed.

When the semiconductor device loss has reached the optimal value, the semiconductor device loss and the circuit parasitic parameter values at that time are output as design data (Step 14). Next, design of the power converter, such as structure design 15, radiator design 16, and filter design 17, are performed by use of the design data, including the optimized semiconductor device loss and circuit parasitic parameters.

Figure 2:
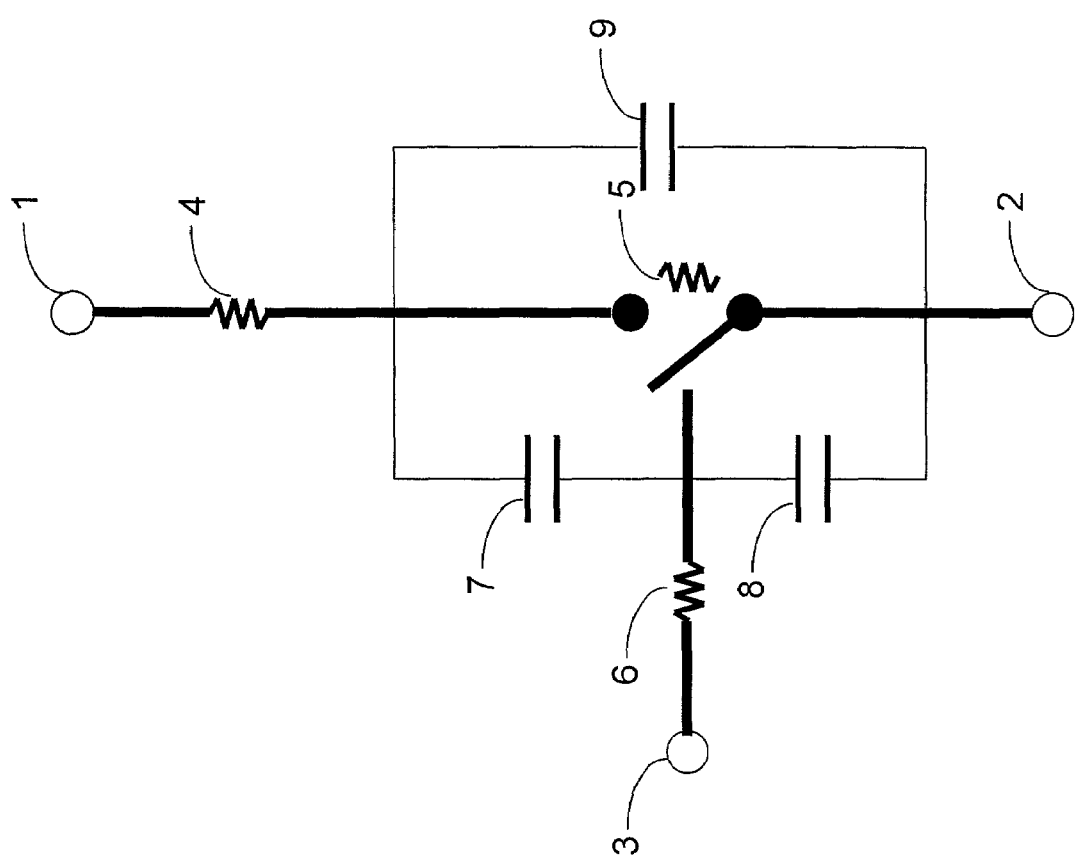
FIG. 2 shows an equivalent circuit of a bipolar device which is used for calculation of semiconductor device loss.

Determination of Semiconductor Device Equivalent Circuit:

FIG. 2 shows an equivalent circuit of a MOSFET determined in Step 6 of FIG. 1 for determination of the semiconductor device equivalent circuit. The equivalent circuit of the MOSFET includes a drain terminal 1, a source terminal 2, a gate terminal 3, a drift layer resistance 4, a channel resistance 5, a gate resistance 6, a gate-drain capacitance 7, a gate-source capacitance 8, and a drain-source capacitance 9. The gate-drain capacitance 7, the gate-source capacitance 8, and the drain-source capacitance 9 change in accordance with voltage between the drain terminal 1 and the source terminal 2.

Figure 3:
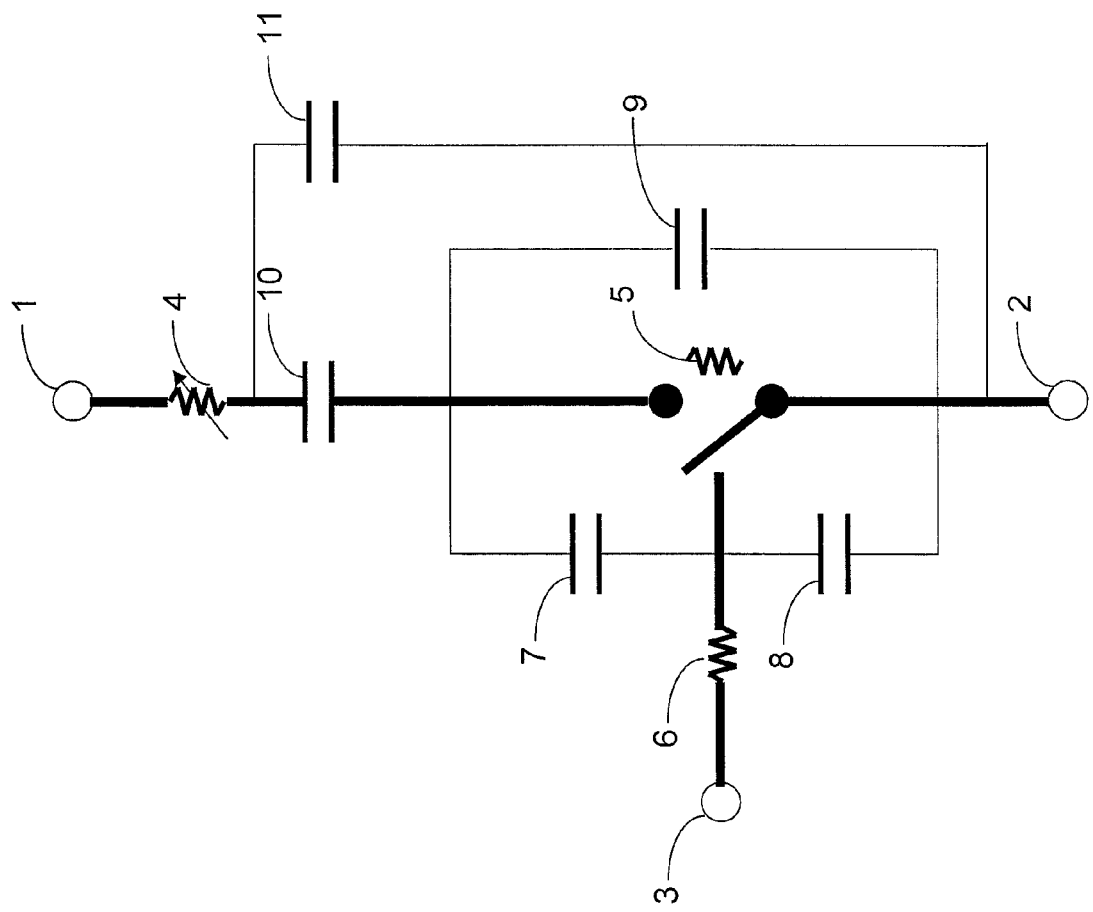
FIG. 3 shows an equivalent circuit of a unipolar device which is used for calculation of semiconductor device loss.

FIG. 3 shows an equivalent circuit of an IGBT determined in Step 6 of FIG. 1 for determination of the semiconductor device equivalent circuit. The equivalent circuit of the IGBT includes a collector terminal 1, an emitter terminal 2, a gate terminal 3, a drift layer resistance 4, a channel resistance 5, a gate resistance 6, a gate-collector capacitance 7, a gate-emitter capacitance 8, a collector-emitter capacitance 9, a capacitance 10 between the drift layer resistance 4 and the channel resistance 5, and a current-depending capacitance 11 between the collector and the emitter. The gate-collector capacitance 7, the gate-emitter capacitance 8, and the collector-emitter capacitance 9 change in accordance with voltage between the collector terminal 1 and the emitter terminal 2. The capacitance 10 between the drift layer resistance 4 and the channel resistance 5, and the current-depending capacitance 11 between the collector and the emitter change in accordance with collector current.

Figure 4:
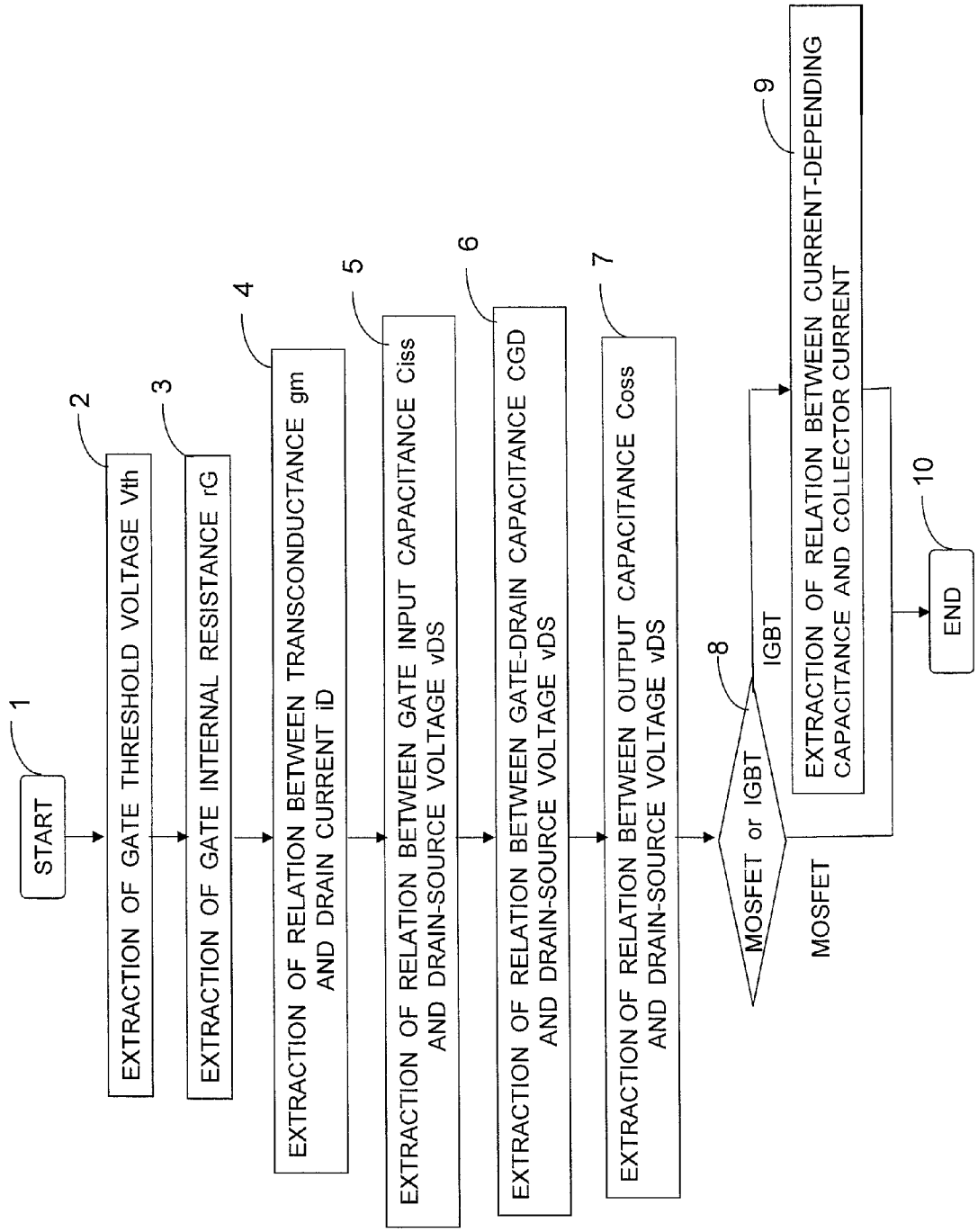
FIG. 4 is a flowchart showing a method of extracting parameters of an equivalent circuit of a switching device.

Extraction of Parameters of Semiconductor Device Equivalent Circuit:

FIG. 4 is a flowchart showing a method of extracting parameters of a semiconductor device equivalent circuit, which is performed in Step 7 of FIG. 1 for extraction of parameters of a semiconductor device equivalent circuit. Work is started from Step 1 of FIG. 4, and in Step 2, a gate voltage threshold Vth is extracted. Next, in Step 3, a gate internal resistance rG is extracted. Subsequently, in Step 4, the relation between transconductance gm and drain current (collector current in the case of IGBT) is extracted. Next, in Step 5, the relation between gate input capacitance Ciss (=CGS+CGD; in the case of IGBT, Cgc+Cge) and drain-source voltage VDS (in the case of IGBT, collector-emitter voltage Vce) is extracted. Subsequently, in Step 6, the relation between gate-drain capacitance CGD (in the case of IGBT, gate-collector capacitance CGC) and drain-source voltage VDS (in the case of IGBT, collector-emitter voltage Vce) is extracted. Next, the relation between output capacitance Coss (=CGD+CDS; in the case of IGBT, Cgc+Cce) and drain-source voltage VDS (in the case of IGBT, collector-emitter voltage Vce) is extracted. Subsequently, determination as to whether the semiconductor device is a MOSFET or an IGBT is performed in Step 8. When the semiconductor device is a MOSFET, the work is ended in Step 10. When the semiconductor device is an IGBT, in Step 9, the relation between current-depending capacitance and collector current is extracted, and the work is then ended in Step 10. Notably, in the extraction of semiconductor device parameters, results of actual measurement or device simulation are used.

Figure 5:
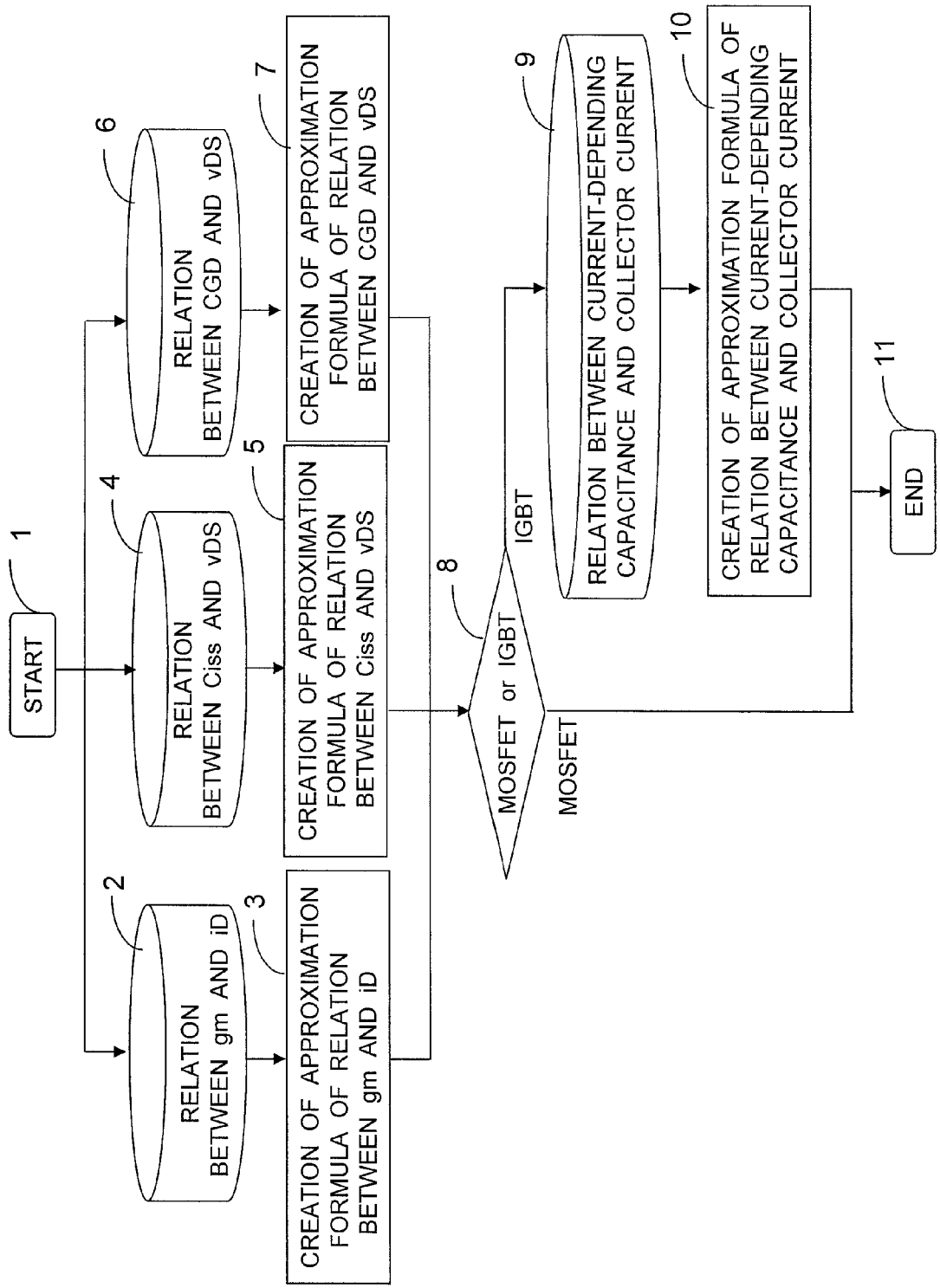
FIG. 5 is a flowchart showing a parameter data creation method using polynomial approximation formulae.

Creation of Semiconductor Device Parameter Data:

FIG. 5 shows an example method of creating parameter data using approximation formulae, which is performed in Step 8 of FIG. 1 for creation of semiconductor device parameter data shown in FIG. 1. Work is started from Step 1 of FIG. 5. Next, in Step 3, the relation between the transconductance gm and the drain current (in the case of IGBT, collector current) is represented by an approximation formula by making use of a relation data 2 regarding the transconductance gm and the drain current iD. Next, in Step 5, the relation between the gate input capacitance Ciss and the drain-source voltage vDS (in the case of IGBT, collector-emitter voltage Vce) is represented by an approximation formula by making use of a relation data 4 regarding the gate input capacitance Ciss and the drain-source voltage VDS. Next, in Step 7, the relation between the gate-drain capacitance CGD (in the case of IGBT, gate-collector capacitance CGC) and the drain-source voltage VDS (in the case of IGBT, collector-emitter voltage Vce) is represented by an approximation formula by making use of a relation data 6 regarding the gate-drain capacitance CGD and the drain-source voltage VDS. Next, in Step 8, determination as to whether the semiconductor device is a MOSFET or an IGBT is made. When the semiconductor device is a MOSFET, the work is ended at Step 11. When the semiconductor device is an IGBT, in Step 10, the relation between the current-depending capacitance and the collector current is represented by an approximation formula by making use of a relation data 9 regarding the current-depending capacitance and the collector current. Next, the work is ended at Step 11.

Figure 6:
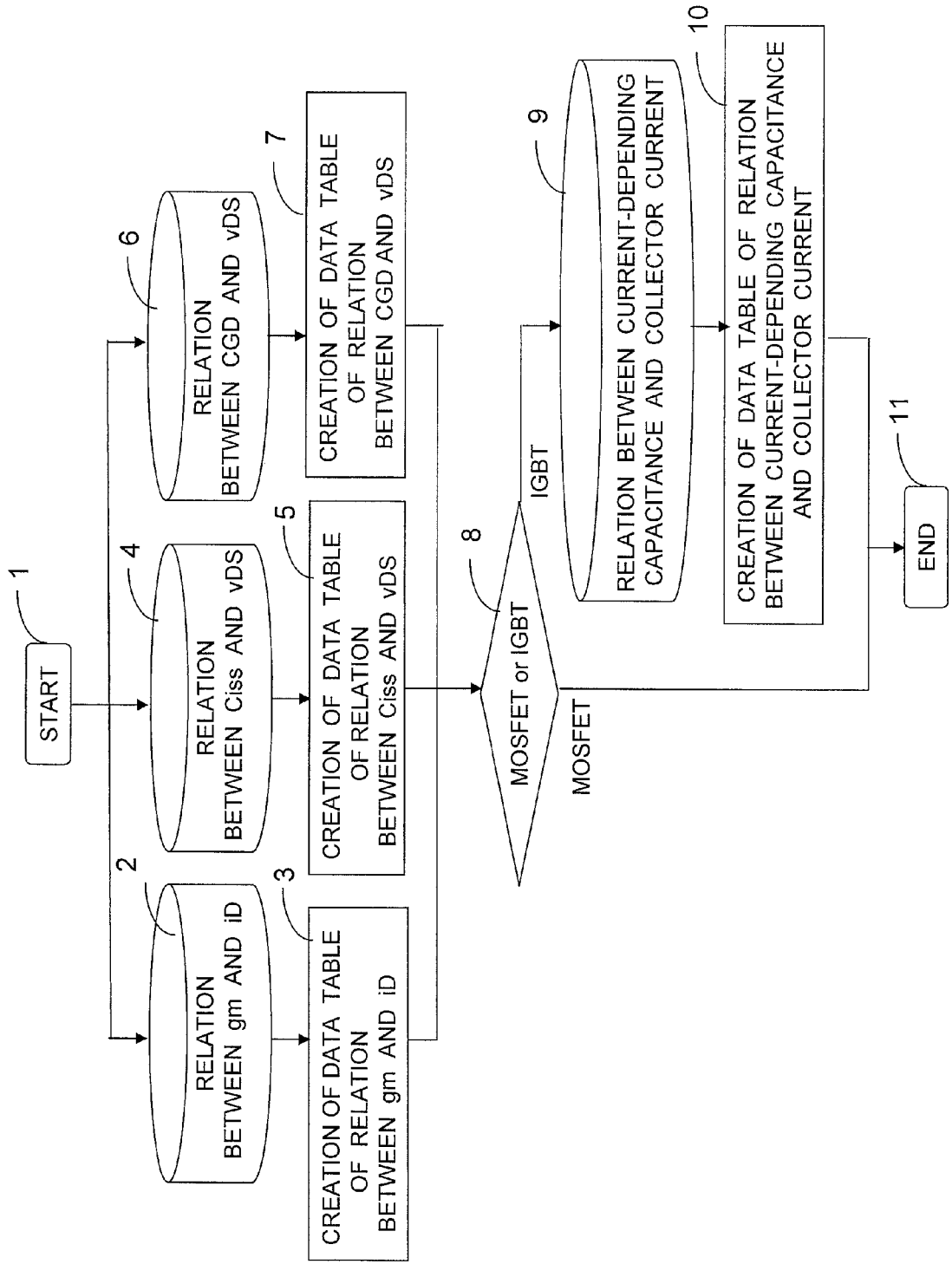
FIG. 6 is a flowchart showing a parameter data creation method using data tables.

FIG. 6 shows an example method of creating parameter data using data tables, which method is performed in Step 8 for creation of semiconductor device parameter data shown in FIG. 1. Work is started from Step 1 of FIG. 6. Next, in Step 3, the relation between the transconductance gm and the drain current (in the case of IGBT, collector current) is represented by a data table by making use of a relation data 2 regarding the transconductance gm and the drain current iD. Next, in Step 5, the relation between the gate input capacitance Ciss and the drain-source voltage VDS (in the case of IGBT, collector-emitter voltage Vce) is represented by a data table by making use of a relation data 4 regarding the gate input capacitance Ciss and the drain-source voltage VDS. Next, in Step 7, the relation between the gate-drain capacitance CGD (in the case of IGBT, gate-collector capacitance CGC) and the drain-source voltage VDS (in the case of IGBT, collector-emitter voltage Vce) is represented by a data table by making use of a relation data 6 regarding the gate-drain capacitance CGD and the drain-source voltage VDS. Next, in Step 8, determination as to whether the semiconductor device is a MOSFET or an IGBT is made. When the semiconductor device is a MOSFET, the work is ended at Step 11. When the semiconductor device is an IGBT, in Step 10, the relation between the current-depending capacitance and the collector current is represented by a data table by making use of a relation data 9 regarding the current-depending capacitance and the collector current. Next, the work is ended at Step 11.

Figure 7:
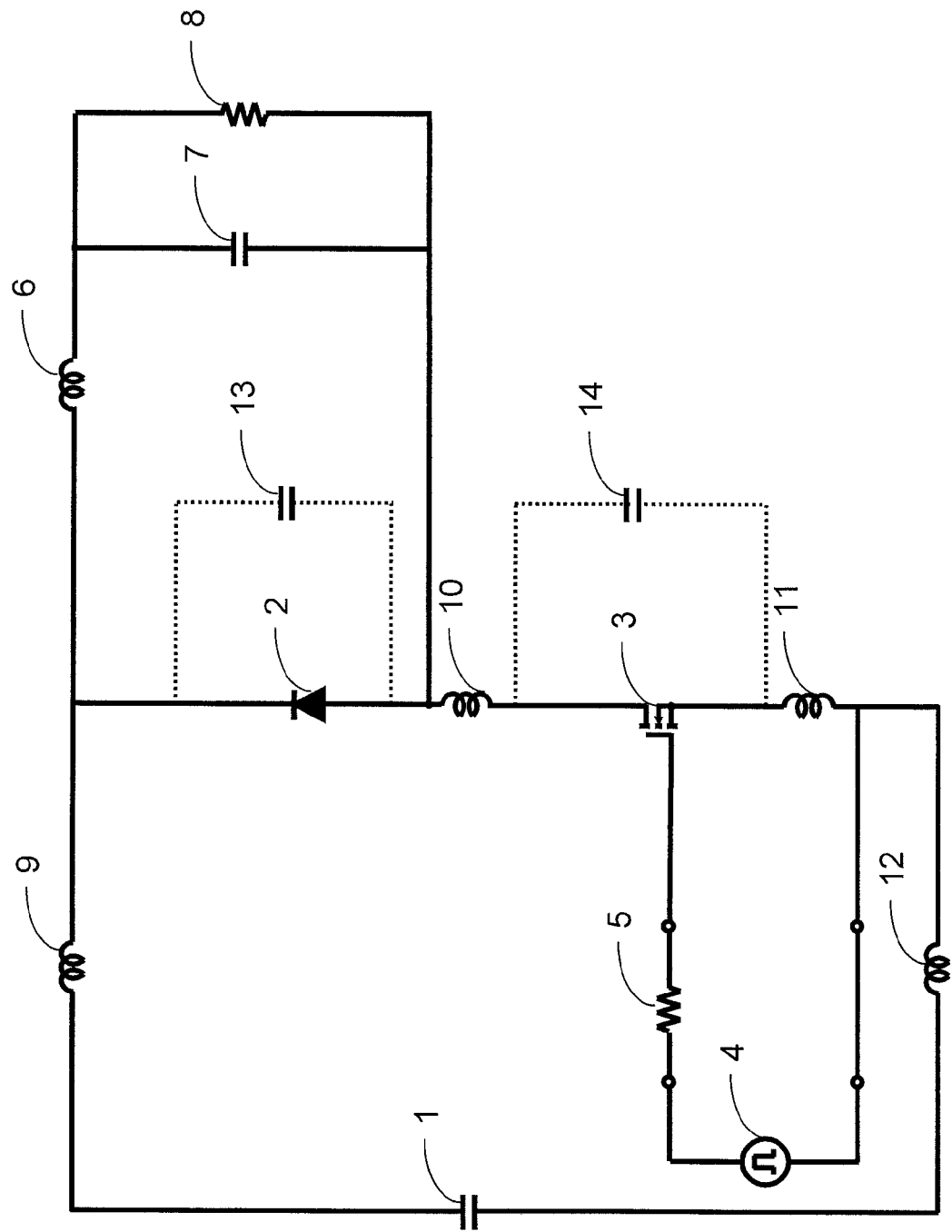
FIG. 7 shows an equivalent circuit of a non-insulating-type step-down chopper.

Calculation of Loss by Use of Semiconductor Device Loss Model:

Next, there will be described a specific example of Step 9 of FIG. 1 for calculating loss by making use of a semiconductor device loss model. FIG. 7 is a diagram showing an equivalent circuit of a non-insulating-type step-down chopper, which is a power converter using a MOSFET. Here, the equivalent circuit is used as a loss model of the MOSFET. This equivalent circuit includes a DC link capacitor 1, a Schottky barrier diode 2, a MOSFET 3, a gate drive circuit 4, a gate resistor 5, a filter inductor 6, a filter capacitor 7, a load resistor 8, a main-circuit high-voltage-side parasitic inductance 9, a parasitic inductance 10 between the Schottky barrier diode and the MOSFET, a parasitic inductance 11 common between the main circuit and a gate circuit, a main-circuit ground-side parasitic inductance 12, a high-voltage side parasitic capacitance 13, and a low-voltage-side parasitic capacitance 14.

Figure 8:
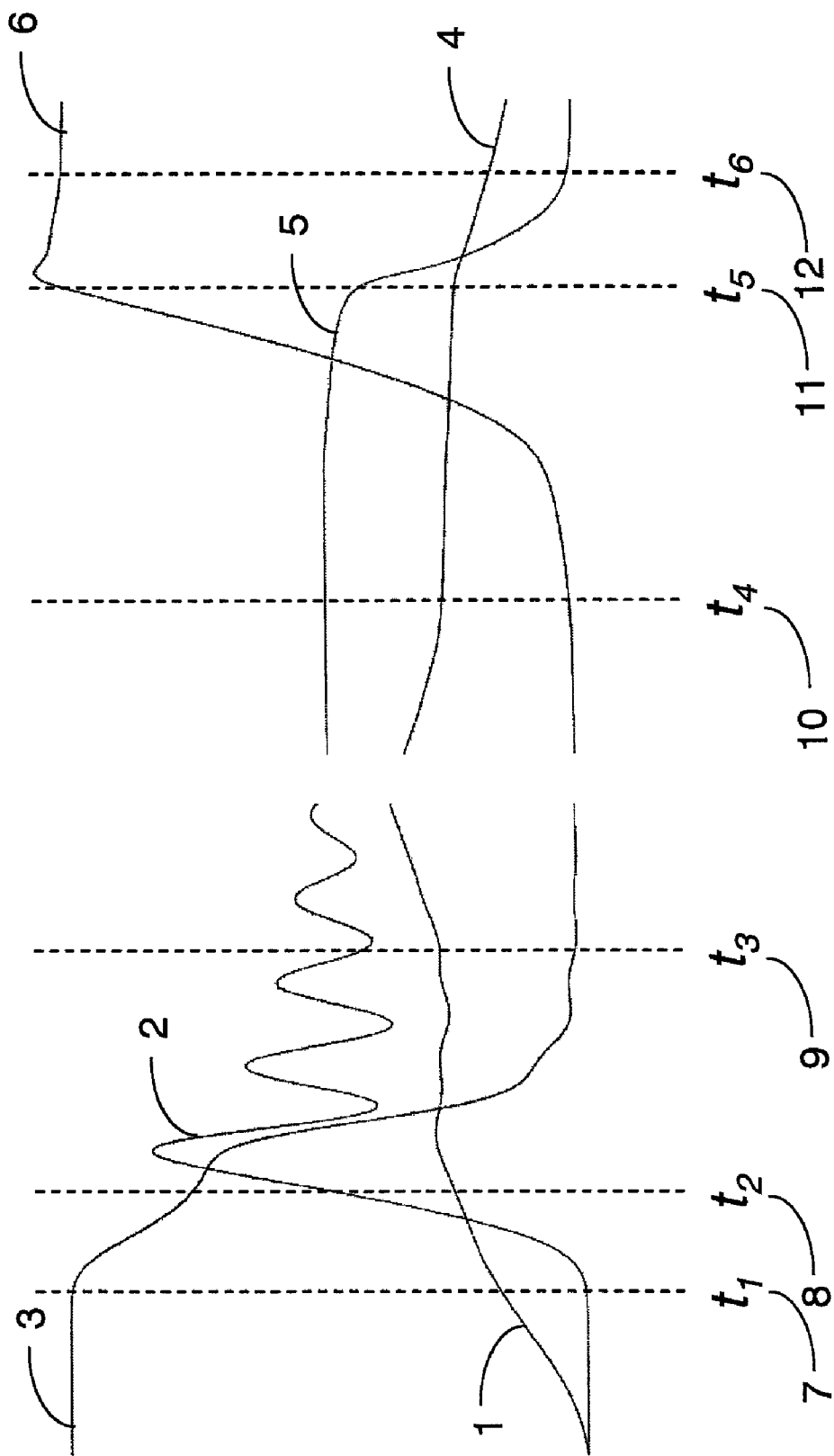

FIG. 8 shows gate-source voltage 1, drain current 2, and drain-source voltage 3 of the MOSFET when it is turned on. FIG. 8 also shows gate-source voltage 4, drain current 5, and drain-source voltage 6 of the MOSFET when it is turned off. FIG. 8 further shows time ($t_1$) 7 at which the drain current starts to flow, time ($t_2$) 8 at which the drain current reaches a load current, time ($t_3$) 9 at which the drain-source voltage reaches the on voltage of the MOSFET, time ($t_4$) 10 at which turn-off operation of the MOSFET starts, time ($t_5$) 11 at which the drain-source voltage reaches the input voltage, and time ($t_6$) 12 at which the drain current reaches zero. An example semiconductor device loss model, which is used in the present semiconductor device loss design method so as to calculate the loss of the semiconductor device, is shown below.

$$Ploss = a \cdot Ron \cdot IL^2 + (Esd + Ediode + ELs + ECs + Eon \cdot t + Eoff \cdot t) \cdot fsw$$

where
a: current conduction ratio of the MOSFET determined from the specifications of the power converter
Ron: on-resistance of the MOSFET
IL: load current of the power converter
Esd: energy associated with discharging of charge accumulated in Coss (=CGD+CDS) of the MOSFET
Ediode: energy associated with charging of charge accumulated in the capacitance of the Schottky barrier diode
ELs: the total sum of energies accumulated in the circuit parasitic inductances 9, 10, 11, and 12 of FIG. 8

ECs: the total sum of energies accumulated in circuit parasitic capacitance 13 and 14 of FIG. 8

Eon-t: switching energy determined by turn-on time

Eoff-t: switching energy determined by turn-off time fsw: switching frequency

Ploss: the sum of conduction loss and switching loss of the switching device.

The drain-source voltage vDS of the MOSFET changes from the input DC voltage Vcc to 0 V between t1 and t3 of FIG. 8. During this period, the charge charged in the output capacitance Coss of the MOSFET is discharged via the channel resistance of the MOSFET (5 in FIG. 2). Since Esd represents the energy consumed by the channel resistance of the MOSFET when the charge accumulated in the output capacitance of the MOSFET is discharged, it can be obtained by integrating the product of the output capacitance and the drain-source voltage; i.e., the quantity of charge, with respect to the drain-source voltage. The range of integration is 0 V to the input DC voltage of the chopper. Accordingly, Esd is expressed by the following equation.

$$E_{sd} = \int_0^{Vcc} C_{oss} \cdot v_{DS} \cdot dv_{DS} \qquad \text{[Eq. 1]}$$

Anode-cathode voltage vdiode of the Schottky barrier diode changes from 0 V to the input DC voltage Vcc between t2 and t3 of FIG. 8. During this period, the capacitance Cdiode of the Schottky barrier diode is charged to Vcc. The charging current is discharged through the drift resistance (4 in FIG. 2) and channel resistance (5 in FIG. 2) of the MOSFET. Accordingly, Ediode can be obtained by integrating the product of the capacitance and the anode-cathode voltage of the Schottky barrier diode; i.e., the quantity of charge, with respect to the anode-cathode voltage. The range of integration is 0 V to the input DC voltage Vcc of the chopper. Accordingly, Ediode is expressed by the following equation.

$$E_{diode} = \int_0^{Vcc} C_{diode} \cdot v_{diode} \cdot dv_{diode} \qquad \text{[Eq. 2]}$$

The drain current 5 of the MOSFET changes from load current IL to 0 A between t5 and t6 of FIG. 8. During this period, the energy accumulated in the circuit parasitic inductances 9, 10, 11, and 12 of FIG. 7 is discharged, and consumed by the resistance component of the MOSFET. Accordingly, ELs can be obtained by the following equation.

$$E_{Ls} = \frac{1}{2} \cdot L_s \cdot I_L^2 \qquad \text{[Eq. 3]}$$

where

Ls: the total sum of the circuit parasitic inductances 9, 10, 11, and 12 of FIG. 7.

Since the high-voltage-side parasitic capacitance 13 of FIG. 7 is charged to Vcc during a period between t2 and t3 of FIG. 8, the charging energy is consumed by the MOSFET. Further, the voltage of the low-voltage-side parasitic capacitance 14 of FIG. 7 changes from Vcc to 0 V during a period between t4 and t5 of FIG. 8, the discharging energy is consumed by the MOSFET. Since ECs is the sum of the charge energy of the high-voltage-side parasitic capacitance 13 of FIG. 7 and the discharging energy of the low-voltage-side parasitic capacitance 14, ECs can be obtained by the following equation.

$$E_{Cs} = \frac{1}{2} \cdot C_s \cdot V_{cc}^2 \qquad \text{[Eq. 4]}$$

where

Cs: the sum of the circuit parasitic capacitances 13 and 14 of FIG. 7.

Next, equations for calculating switching energy Eon-t, which is determined by the turn on time, will be described. The gate-source voltage vGS 1 is represented by the following equation in the period between t1 and t2 of FIG. 8.

$$v_{GS}(t) = V_{GH} - \frac{V_{GH} - V_{th}}{T_2 - T_3}\left(T_2 \exp\left(-\frac{t}{T_2}\right) - T_3 \exp\left(-\frac{t}{T_3}\right)\right) \qquad \text{[Eq. 5]}$$

$$T_2 = \frac{2A}{B + \sqrt{B^2 - 4A}} \qquad \text{[Eq. 6]}$$

$$T_3 = \frac{2A}{B - \sqrt{B^2 - 4A}} \qquad \text{[Eq. 7]}$$

$$A = R_G \cdot g_m \cdot C_{GD} \cdot L_s \qquad \text{[Eq. 8]}$$

$$B = R_G \cdot (C_{GS} + C_{GD}) + L_{s4} \cdot g_m \qquad \text{[Eq. 9]}$$

$$R_G = r_G + R_{Gex} + r_{GD} \qquad \text{[Eq. 10]}$$

where

VGH: the maximum value of gate voltage

Vth: threshold voltage

RG: gate resistance gm: transconductance

CGD: gate-drain capacitance

Ls: the total sum of main-circuit parasitic inductances

CGS: gate-source capacitance

Ls4: parasitic inductance of common wiring of the main circuit and the gate circuit (11 in FIG. 8)

rG: gate internal resistance of the MOSFET

RGex: external gate resistance rGD: internal resistance of the gate circuit.

Further, the drain current 2 of FIG. 8 is represented by the following equation.

$$i_D(t) = g_m(V_T - v_{GS}(t)) \qquad \text{[Eq. 11]}$$

where vGS in Eq. 11 is represented by Eq. 5.

The drain-source voltage vDS 3 is represented by the following equation in the period between t2 and t3 of FIG. 8.

$$v_{DS}(t) = V^* - \left(\frac{V_{GH} - (V_T + I_L/g_m)}{R_G \cdot C_{GD}}\right) \cdot t \qquad \text{[Eq. 12]}$$

where V* represents the value of vDS at t=t2.

The switching energy Eon-t between t1 and t3 of FIG. 8, which is determined by the turn-on time, is represented by the following equation.

$$E_{on-t} = V_{cc} \int_{t_1}^{t_2} i_D \cdot dt + I_L \int_{t_2}^{t_3} v_{DS} \cdot dt - E_{Ls} \qquad \text{[Eq. 13]}$$

where iD is represented by Eq. 11, vDS is represented by Eq. 12, and ELs is represented by Eq. 13.

Next, equations for calculating switching energy Eoff-t, which is determined by the turn-off time, will be described.

The drain-source voltage vDS 6 is represented by the following equation in the period between t4 and t5 of FIG. 8.

$$v_{DS}(t) = V_{on} + \left(\frac{V_T + I_L/g_m}{R_G \cdot C_{GD}}\right) \cdot t \qquad [\text{Eq. 14}]$$

where
Von: on voltage of the MOSFET
The gate-source voltage vGS 4 is represented by the following equation in the period between t5 and t6 of FIG. 8.

$$v_{GS}(t) = \frac{V_{th} + \frac{I_L}{g_m}}{T_2 - T_3}\left(T_2 \exp\left(-\frac{t}{T_2}\right) - T_3 \exp\left(-\frac{t}{T_3}\right)\right) \qquad [\text{Eq. 15}]$$

The drain current 2 is represented by the following equation in the period between t5 and t6 of FIG. 8.

$$i_D(t) = g_m(V_T - v_{GS}(t)) \qquad [\text{Eq. 16}]$$

where vGS in Eq. 16 is represented by Eq. 15.

The switching energy Eoff-t between t4 and t5 of FIG. 8, which is determined by the turn-off time, is represented by the following equation.

$$E_{off\text{-}t} = I_L \int_{t_4}^{t_5} v_{DS} \cdot dt + V_{cc} \int_{t_5}^{t_6} i_D \cdot dt - E_{Cs} - E_{sd} - E_{diode} \qquad [\text{Eq. 17}]$$

where vDS is represented by Eq. 14, iD is represented by Eq. 16, ECs is represented by Eq. 4, Esd is represented by Eq. 1, and Ediode is represented by Eq. 2.

Semiconductor Device Loss Model for Bipolar Device:

Next, there will be described another example semiconductor device loss model, which is used in Step 9 of FIG. 1 for calculation of loss of a semiconductor device, in which the semiconductor device is a bipolar device; that is, the switching semiconductor device is an IGBT, and the diode is a PiN diode. The semiconductor device loss model in this case is shown below.

$$P_{loss} = a \cdot V_{on} \cdot I_L^2 + (E_{sd} + E_{diode} + E_{Ls} + E_{Cs} + E_{on\text{-}t} + E_{off\text{-}t}) \cdot f_{sw}$$

where
a: current conduction ratio of the IGBT determined from the specifications of the power converter
Von: on-voltage of the IGBT
IL: load current of the power converter
Esd: energy associated with discharging of charge accumulated within the IGBT
Ediode: energy associated with charging of charge accumulated within the PiN diode
ELs: the total sum of energies accumulated in the circuit parasitic inductances 9, 10, 11, and 12 of FIG. 8
ECs: the total sum of energies accumulated in circuit parasitic capacitance 13 and 14 of FIG. 8
Eon-t: switching energy determined by turn-on time
Eoff-t: switching energy determined by turn-off time
fsw: switching frequency
Ploss: the sum of conduction loss and switching loss of the IGBT.

When the IGBT is on, minority carrier is accumulated therein. The quantity of accumulated charge depends on the collector current of the IGBT. When the IGBT is tuned off, the accumulated charge, which has current dependency, is discharged, whereby switching loss is generated. Further, as in the case of MOSFET, the IGBT has a capacitance which has voltage dependency. According, Esd is represented by the following equation.

$$E_{sd} = \int_0^{V_{cc}} Q_{sd\text{-}v} \cdot dv_{ce} + \int_0^{I_L} Q_{sd\text{-}i} \cdot di_{sd} \qquad [\text{Eq. 18}]$$

where
Qsd-v: the quantity of charge accumulated in the IGBT and having voltage dependency
Qsd-i: the quantity of charge accumulated in the IGBT and having current dependency
vce: collector-emitter voltage of the IGBT
isd: collector current of the IGBT
Vcc: input voltage of the power converter
IL: load current.

As in the case of the IGBT, when the PiN is in an on-state, minority carrier is accumulated therein. The quantity of accumulated charge depends on anode current of the PiN diode. When the PiN is turned off, the accumulated charge having current dependency is discharged, and the discharged current flows into the IGBT, whereby switching loss is generated at the IGBT. Further, as in the case of the Schottky barrier diode, the PiN diode has a capacitance having voltage dependency. Accordingly, Ediode is represented by the following equation.

$$E_{diode} = \int_0^{V_{cc}} Q_{diode\text{-}v} \cdot dv_{diode} + \int_0^{I_L} Q_{diode\text{-}i} \cdot di_{diode} \qquad [\text{Eq. 19}]$$

Qdiode-v: the quantity of charge accumulated in the PiN diode device and having voltage dependency
Qdiode-i: the quantity of charge accumulated in the PiN diode device and having current dependency
vdiode: anode-cathode voltage of the PIN diode device
idiode: anode current of the PiN diode device Next, a second embodiment of the present invention will be described with reference to FIGS. 9 to 18. The second embodiment is a power converter comprehensive design method which is applied to a three-phase inverter. In this design method, primary design parameters of a power converter; i.e., true parameters, and extrinsic parameters, such as circuit parasitic inductances and circuit parasitic capacitances of the power converter are separated. The design method uses database of semiconductor device loss, semiconductor device over-voltage, filter loss, and filter frequency characteristic in which the extrinsic parameters are used as parameters.

Figure 9:
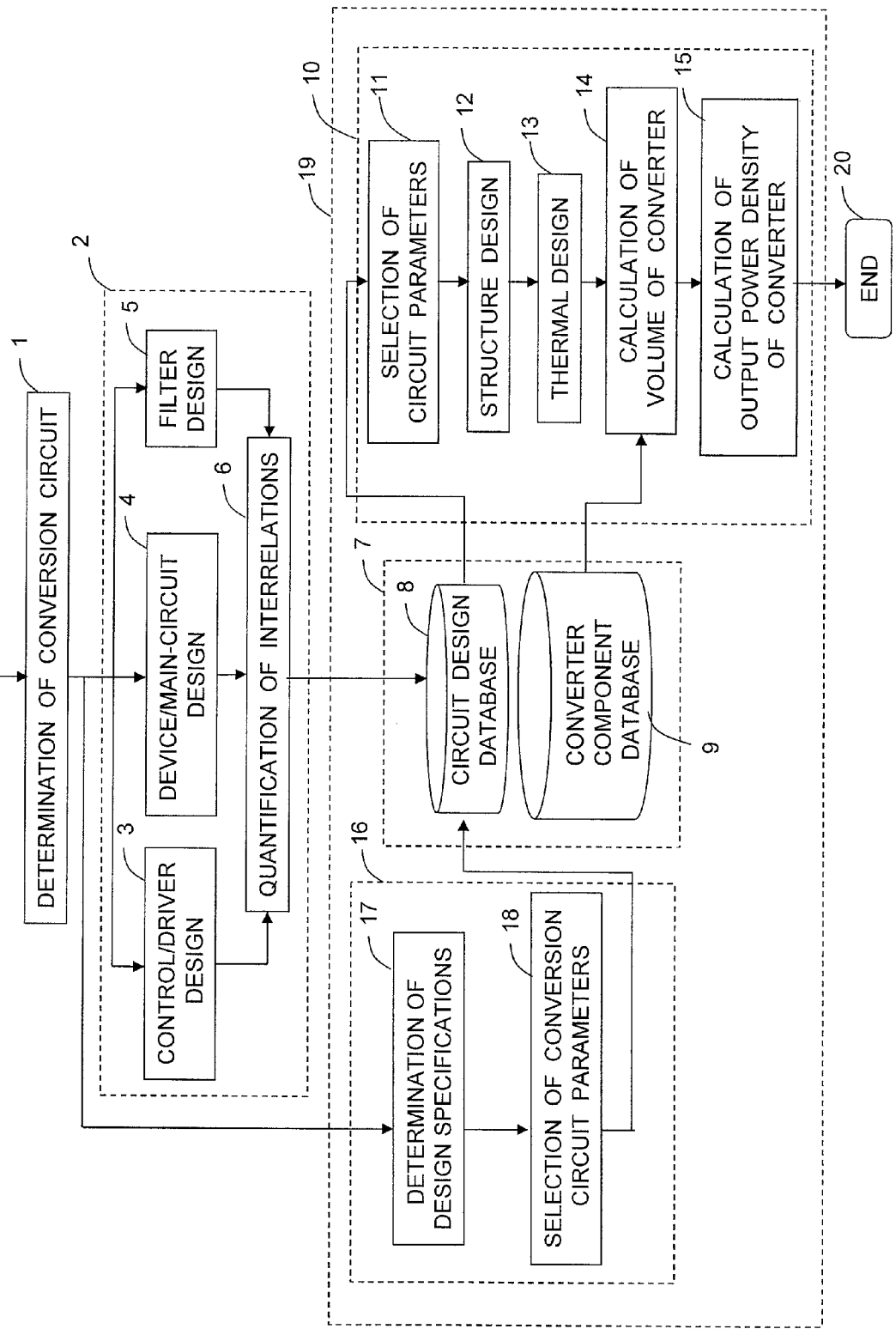
FIG. 9 is a flowchart showing steps for designing a power converter.

FIG. 9 is a power converter design flowchart used for design of power converters in the present invention. The flowchart of FIG. 9 is mainly composed of Step 2 for quantifying interrelations of components of a power conversion circuit and obtaining data for creation of database; and Step 19 for designing a converter by making use of obtained data. Step 19 for designing a converter is composed of a power converter design database 7, Step 16 for setting parameters of a power converter to be designed, and power converter comprehensive design 10, including structure design, electromagnetic design, and thermal design.

In the design flowchart of FIG. 9 for power converters, design work is started from Step 0. Next, in Step 1 for conversion circuit determination, a conversion circuit scheme of a power converter to be designed is determined.

In Step 2 of FIG. 9 for quantifying interrelations of components of a power conversion circuit, input data for creating a circuit design database are obtained experimentally or through simulation. After the conversion circuit scheme is determined in Step 1, steps for designing components of the conversion circuit, such as Step 3 for control/driver design, Step 4 for device/main-circuit design, and Step 5 for filter design, are separately performed. In each step, design parameters are extracted. In Step 6 for quantification of interrelations, the interrelations are calculated experimentally or through theoretical analysis, and input to a circuit design database 8, which is contained in a power converter design database 7.

Step 16 of FIG. 9 for setting parameters of the power converter to be designed is composed of Step 17 for determining design specifications, and Step 18 for determining converter parameters.

The power converter design database 7 of FIG. 9 is composed of the circuit design database 8 and a material database 9. By means of inputting the converter parameters determined in Step 18 of FIG. 9, in Step 11 for circuit parameter selection, circuit parasitic parameters, such as circuit parasitic inductances and circuit parasitic capacitances, which are generated due to the wiring structure of the main circuit are selected.

The power converter comprehensive design 10 of FIG. 9, including structure design, electromagnetic design, and thermal design, is composed of converter comprehensive design components such as Step 12 for performing structure design, Step 13 for performing thermal design, Step 14 for calculating the volume of the converter, and Step 15 for calculating the output power density of the converter. The circuit parasitic parameters determined in Step 11 of FIG. 9 for circuit parameter selection are used in Step 12 for performing structure design, whereby a structure which satisfies the determined circuit parasitic parameters is designed. In Step 13 for performing thermal design, a cooling unit is designed so that a semiconductor device used with the designed structure is maintained at a predetermined temperature or lower. In Step 14, the volume of the power converter is calculated from the volumes of the above-described structure and cooling unit, and those of other components of the power converter. In Step 15, the output power density (OPD) of the power converter is calculated.

Figure 10:
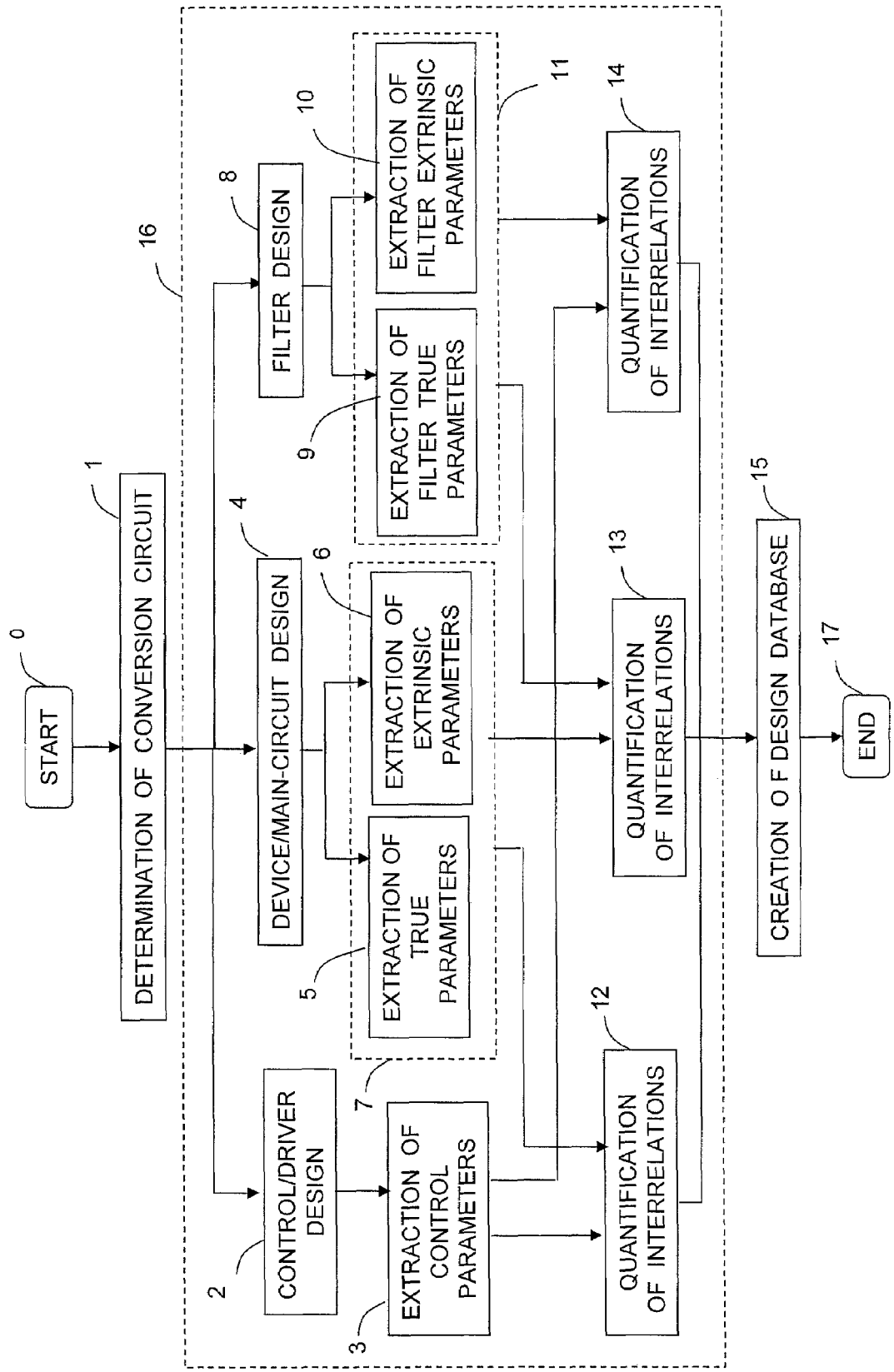
FIG. 10 is a flowchart showing steps for creating a design database.

FIG. 10 is a flowchart for creating a design database used in the converter design in the present embodiment. A section 16 of FIG. 10 shows the detail of Step 2 of FIG. 9 for quantifying interrelations of components of a power conversion circuit and obtaining data for creation of a circuit design database. Work is started from Step 0 of FIG. 10, and a conversion circuit scheme is determined in Step 1. In Step 2, control/driver design is started, and in Step 3, parameters, such as switching frequency, switching speed, and switching pattern, for driving the converter are selected. The control parameters obtained in Step 3 are used in Step 12 for quantifying interrelations of control/drive design parameters and in Step 14 for quantifying interrelations of filter design parameters. The device/main-circuit design is started in Step 4, and true parameters of the semiconductor device and extrinsic parameters attributable to the wiring structure are extracted in Steps 5 and 6. The parameters obtained in Steps 5 and 6 are used, as device/main-circuit parameters 7, in Step 12 for quantification of interrelations of control/driver design parameters-and Step 13 for quantification of interrelations of device/main-circuit design parameters. Further, filter design is started in Step 8, and true parameters of a magnetic material and extrinsic parameters attributable to the filter wiring structure are extracted in Steps 9 and 10. The filter parameters 11 are used in Step 13 for quantification of interrelations of device/main-circuit design parameters, and Step 14 for quantification of interrelations of filter design parameters. The relations obtained in Steps 12, 13, and 14 are input to a database 15, whereby the database of semiconductor device loss, semiconductor device over-voltage, filter loss, and filter frequency characteristic is created in which the extrinsic parameters stemming from the main circuit wiring structure are used as parameters.

Figure 11:
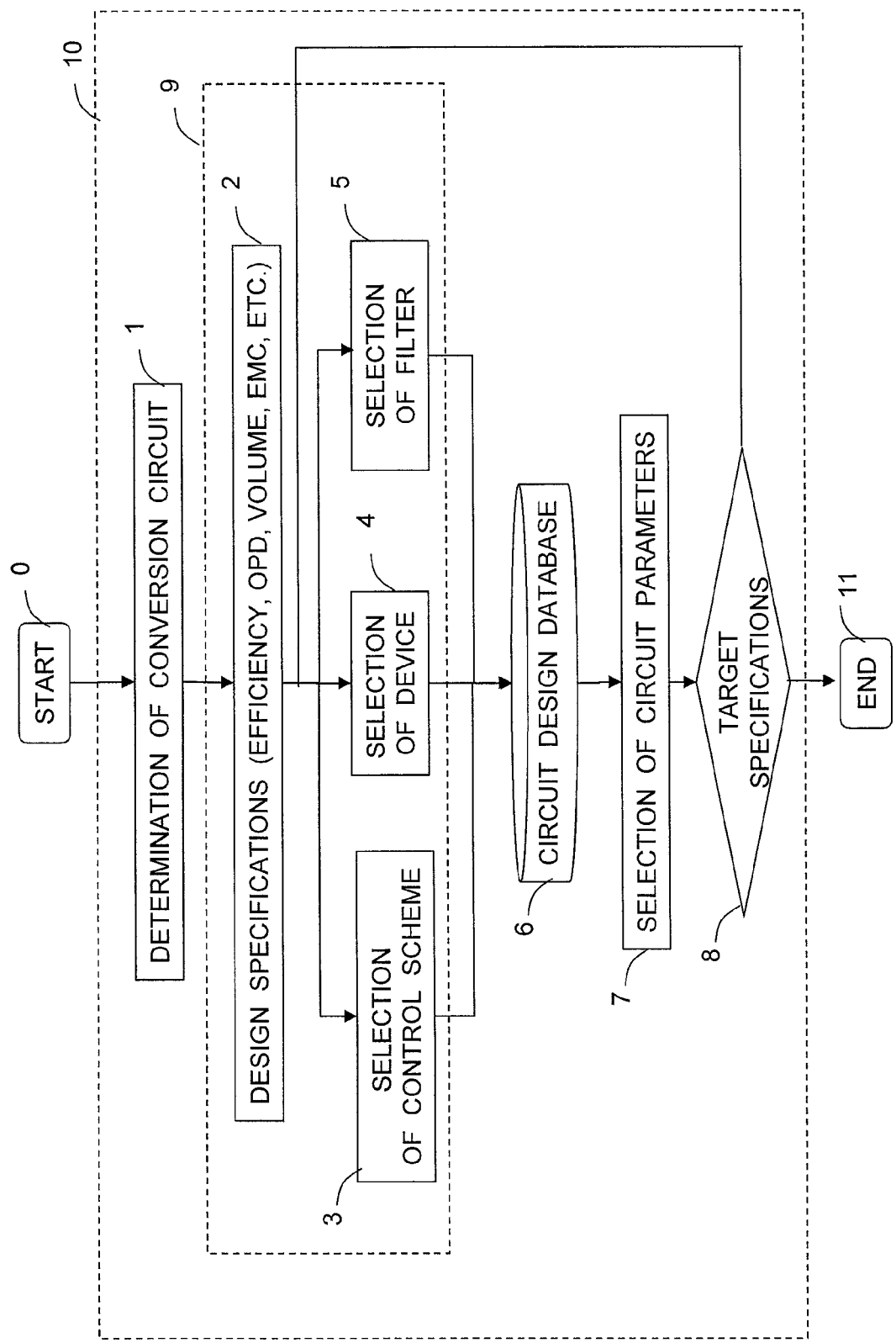
FIG. 11 is a flowchart showing steps for extracting optimal parameters.

FIG. 11 is a flowchart for selecting optimal parameters for realizing the target specifications of the converter by making use of the database created by the process of FIG. 10. A section 10 of FIG. 11 is a portion of Step 19 of FIG. 9 for converter deign, and a section 9 of FIG. 11 corresponds to Step 16 of FIG. 9 for determination of converter parameters. A converter circuit scheme is determined in Step 1, and specifications of a power converter to be designed are determined in Step 2. Next, control parameters are determined in Step 3, a device is selected in Step 4, and a filter is selected in Step 5. The parameters determined in Steps 3, 4, and 5 are input to the above-described design database denoted by 6. In Step 7, extrinsic parameters which satisfy the target parameters are output. At this time, when it is determined in Step 8 that extrinsic parameters which satisfy the target specifications are not present, Steps 3, 4, and 5 are performed again, and selection of extrinsic parameters which satisfy the target specifications is performed.

Figure 12:
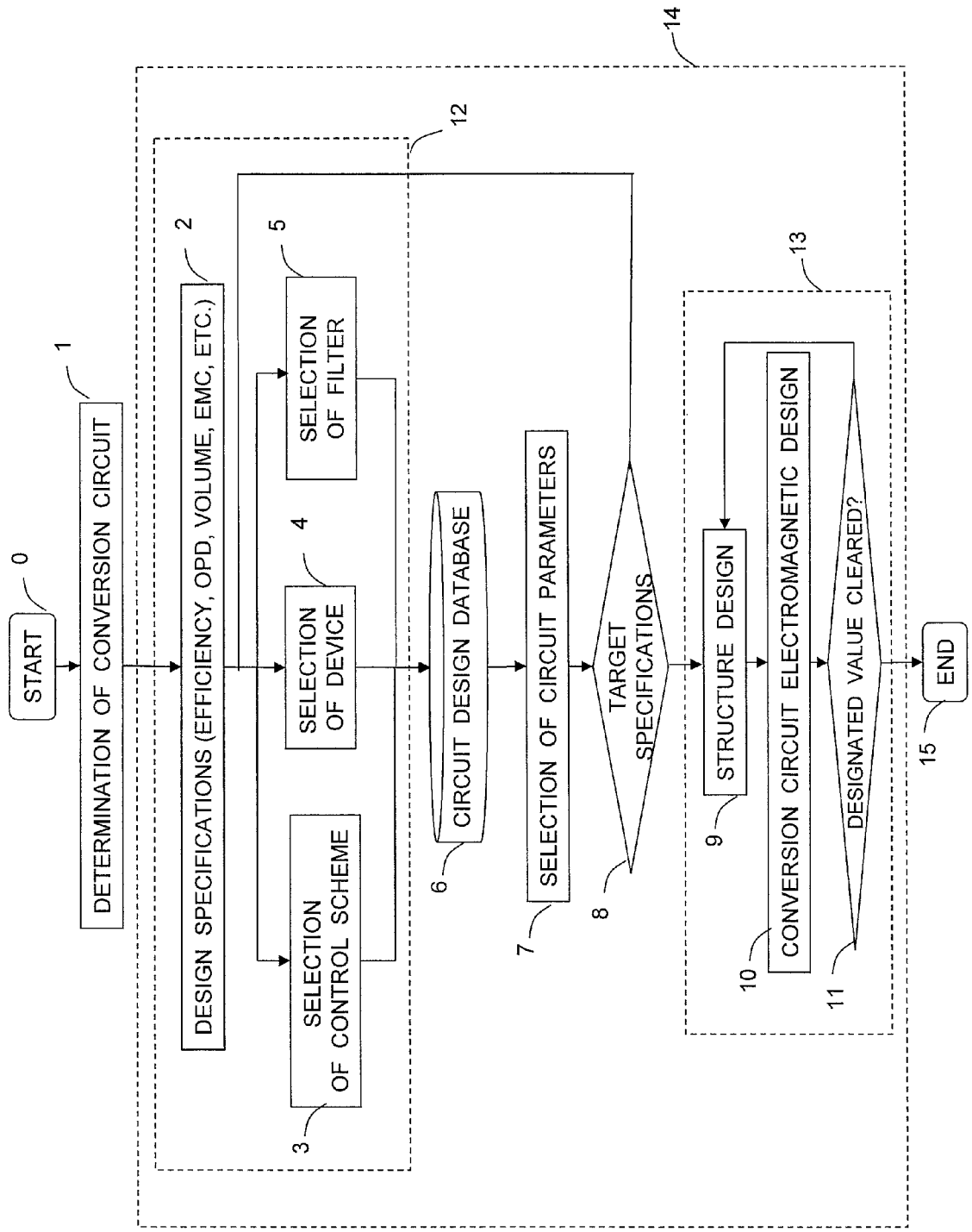
FIG. 12 is a flowchart showing steps for structure design of the power converter.

FIG. 12 is an example in which structure/electromagnetic design of a power conversion circuit is performed by making use of the results of the parameter selection of FIG. 11. A section 14 of FIG. 12 is a portion of Step 19 of FIG. 9 for converter design, a section 12 of FIG. 12 corresponds to Step 16 of FIG. 9 for determination of conversion parameters, and a section 13 of FIG. 12 corresponds to a portion of Step 10 of FIG. 9 for comprehensive design. The results of selection of circuit parasitic inductances and parasitic capacitances which are obtained by the flowchart of FIG. 10 and satisfy the target specifications (results obtained in Step 7 of FIG. 12) is used in Step 9 of FIG. 12 for structure design so as to design a wiring structure of the conversion circuit. For the wiring structure designed in Step 9, parasitic inductances and parasitic capacitances are calculated in Step 10 for electromagnetic design of the converter circuit. When it is determined in Step 11 that the values designated in Step 7 are attained, the operation is ended in Step 12. When it is determined in Step 11 that the values designated in Step 7 are not attained, Step 9 for structure design is executed again.

Figure 13:
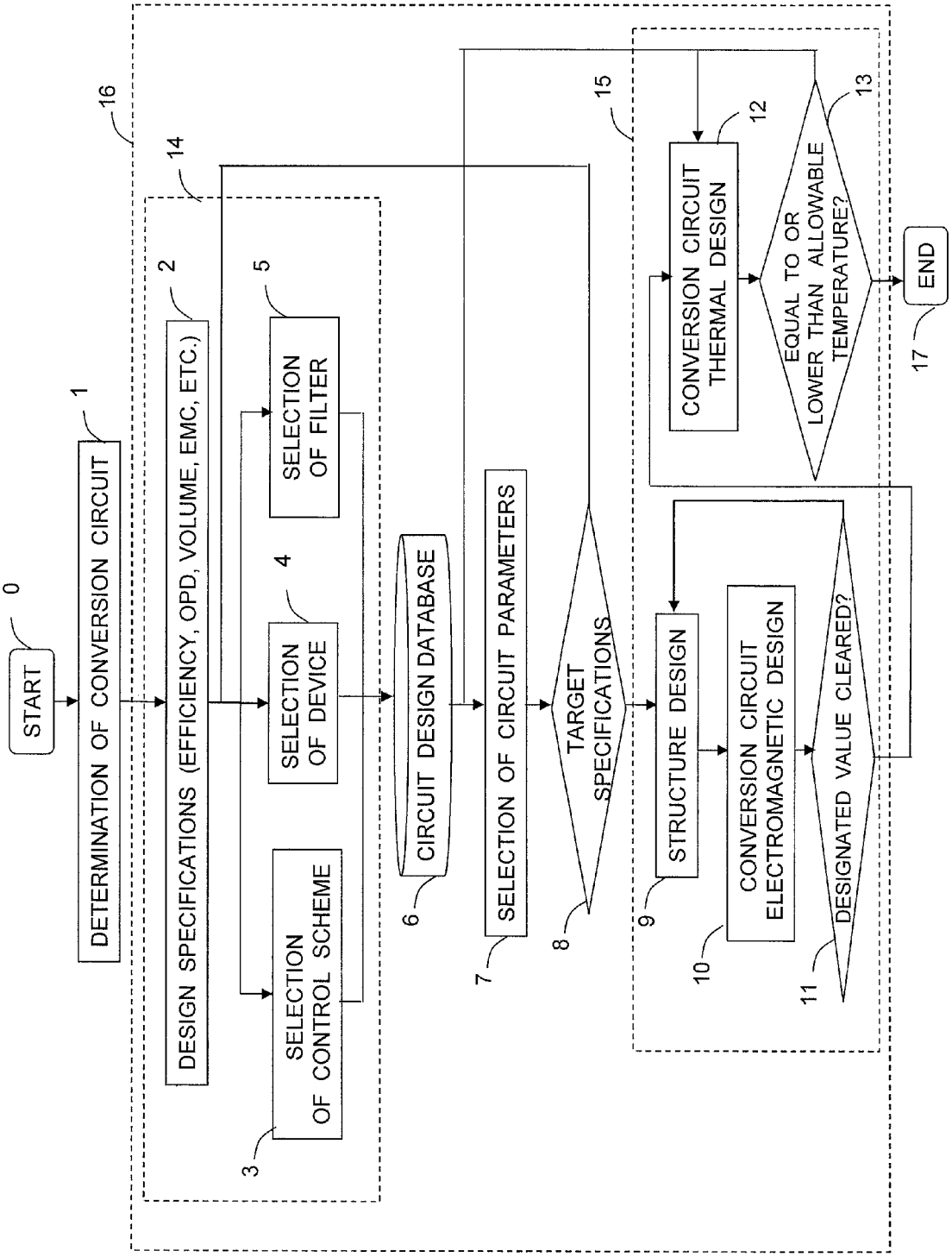
FIG. 13 is a flowchart showing steps for thermal design of the power converter.

FIG. 13 shows an example in which thermal design of the power conversion circuit by making use of the results of the structure design and the conversion circuit electromagnetic design of FIG. 12. A section 16 of FIG. 13 is a portion of Step 19 of FIG. 9 for converter design, a section 14 of FIG. 13 corresponds to Step 16 of FIG. 9 for determination of conversion parameters, and a section 15 of FIG. 13 corresponds to a portion of Step 10 of FIG. 9 for comprehensive design. In Step 12 for designing thermal behavior of the power converter, operating temperatures of the converter, such as operating temperatures of the semiconductor device and the filter, in consideration of the wiring structure determined in Step 9, loss of the semiconductor device obtained from the parasitic parameters selected in Step 7 and determined in Step 8 to satisfy the target specifications, loss of the filter, loss stemming from the parasitic resistance components of bonding wires which connect the semiconductor device and a conversion circuit board, loss stemming from the parasitic resistance components of terminals for connection between the conversion circuit board and passive components such as a filter, loss stemming from the parasitic resistance component of DC-side wiring, along with heat radiation conditions determined by the manner of connection of components of the power conversion circuit. In Step 13, determination is made as to whether the operating temperature of a section subjected to thermal design falls within a predetermined allowable range.

When the operating temperature does not fall within the predetermined allowable range, the design operation or work returns to Step 12 for conversion circuit thermal design. This process is repeated until the operating temperature falls within the predetermined allowable range.

Figure 14:
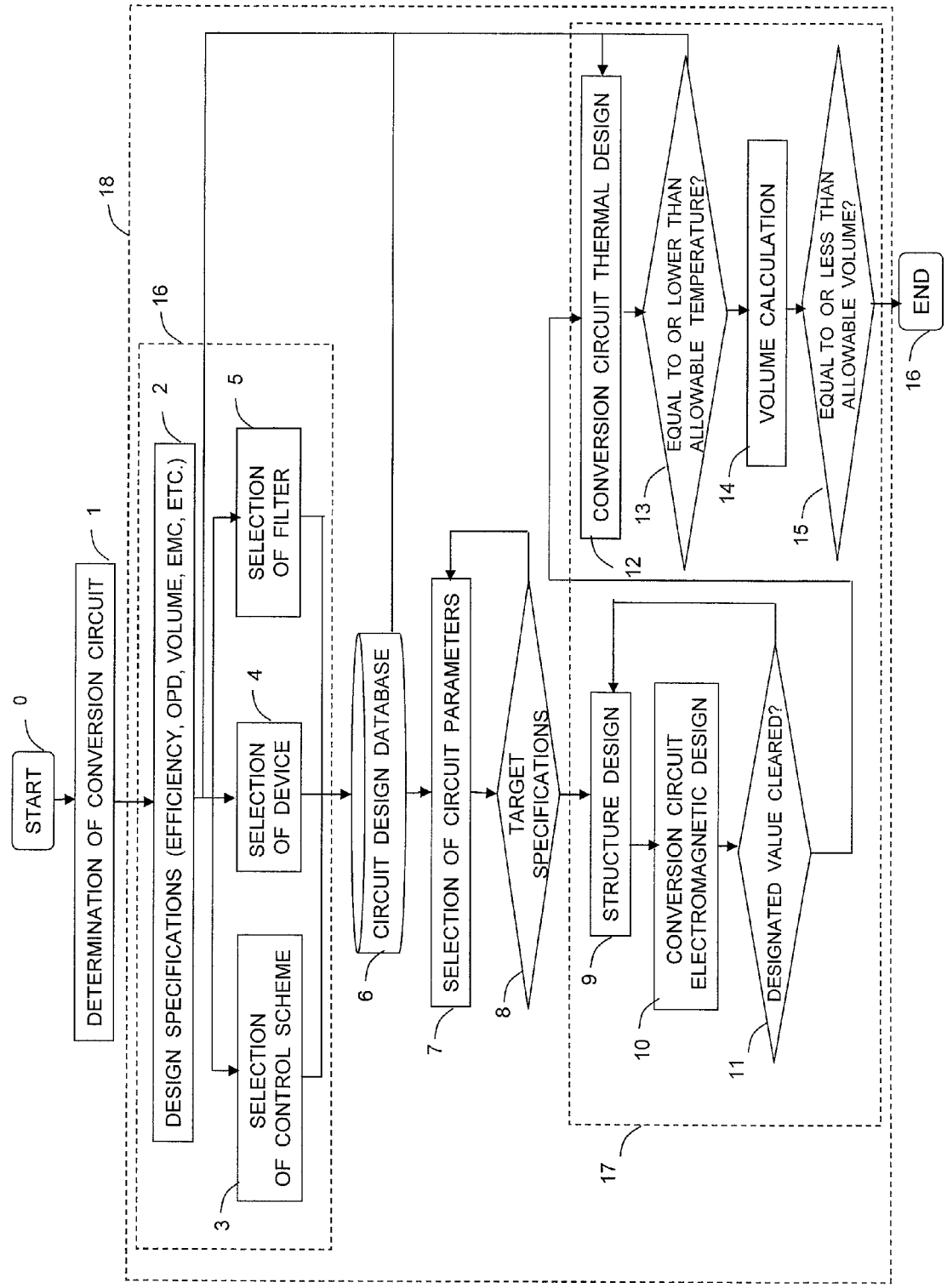
FIG. 14 is a flowchart showing steps for calculating the volumes of main components of the power converter.

FIG. 14 is a flowchart for obtaining the volumes of the cooling unit, the filter, etc. Specifically, in Step 14, the volumes of the cooling unit, the filter, etc., are obtained by making use of the results of the thermal design performed in Step 12 of FIG. 13. A section 18 of FIG. 14 is a portion of Step 19 of FIG. 9 for converter design, a section 16 of FIG. 14 corresponds to Step 16 of FIG. 9 for determination of conversion parameters, and a section 17 of FIG. 14 corresponds to a portion of Step 10 of FIG. 9 for comprehensive design. When it is determined in Step 15 that the volumes of the cooling unit and the filter, which account for a major portion of the volume of the power converter, do not fall within predetermined ranges, the design operation or work returns to Step 12 for thermal design of the converter or the point immediately before Steps 3, 4, and 5. This process is repeated until the volumes fall within the respective allowable ranges.

Figure 15:
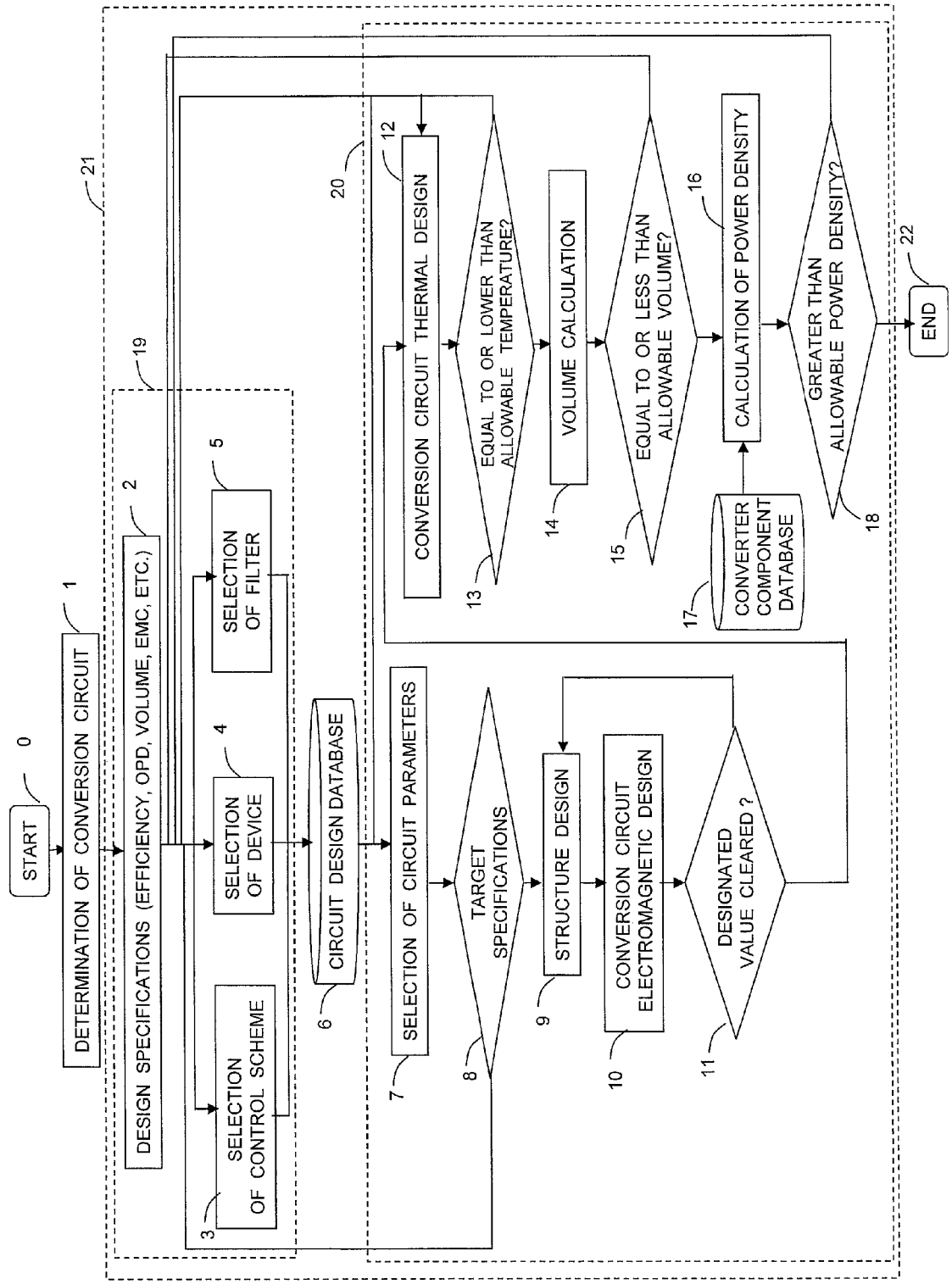
FIG. 15 is a flowchart showing steps for calculating the power density of the power converter.

FIG. 15 is a flowchart for designing the output power density (OPD) of the power converter by making use of the volumes of the filter and the cooling unit obtained in the process of FIG. 14. A section 21 of FIG. 15 is a portion of Step 19 of FIG. 9 for converter design, a section 19 of FIG. 15 corresponds to Step 16 of FIG. 9 for determination of conversion parameters, and a section 20 of FIG. 15 corresponds to a portion of Step 10 of FIG. 9 for comprehensive design. In Step 16, the volumes of other components of the conversion circuit obtained from the converter components database 17 (corresponding to the database 9 of FIG. 9) are added to the obtained volumes of the filter and the cooling unit so as to calculate the output power density (OPD) of the power converter. When it is determined in Step 18 that the output power density (OPD) does not reach the target value, the design operation or work returns to Steps 3, 4, and 5 so as to again perform the OPD calculation. This process is repeated until the output power density (OPD) reaches the target value.

The above is a flowchart of a power converter thermal design method proposed in the present invention. The flowcharts of FIGS. 10 to 15 for the power converter comprehensive design method proposed in the present invention can be applied not only to power converters but also to control apparatuses, such as gate drive circuits used for driving semiconductor devices disposed in power converters.

Figure 16:
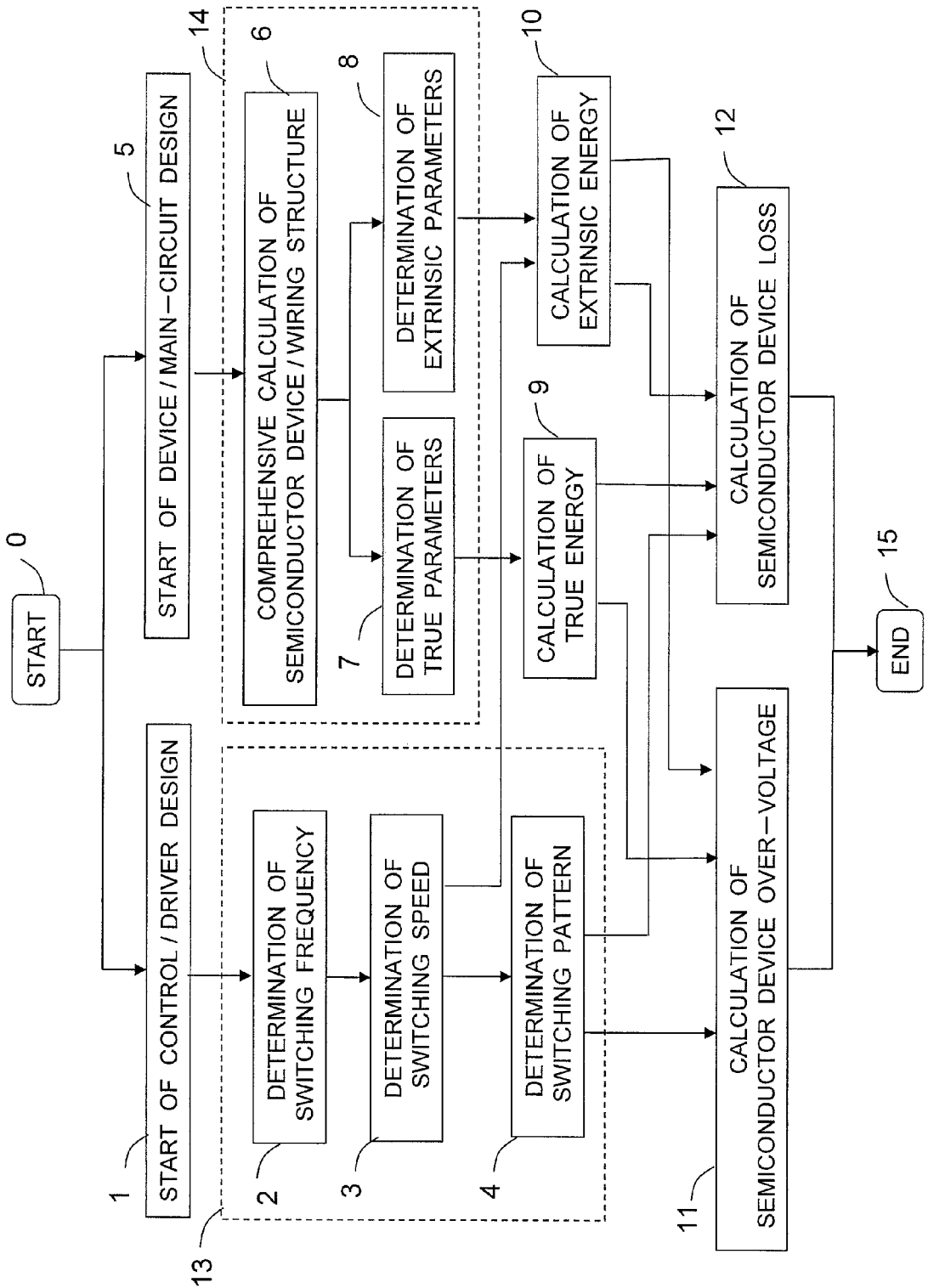
FIGS. 16 to 18 are detailed diagrams showing quantification of interrelations.

Next, the details of Steps 12, 13, and 14 of FIG. 10 for quantification of interrelations will be described. FIG. 16 is a flowchart for performing Step 12 of FIG. 10. While attention is paid to the control design parameters and the device/main-circuit design parameters, the relations between the control parameters and the device/main-circuit parameters and the semiconductor device loss and the semiconductor device over-voltage are quantified. Control/driver design is started in Step 1. In Steps 2, 3, and 4, a switching frequency, a switching speed, and a switching pattern, which are parameters of the control/driver design, are determined. A section 13 of FIG. 16, which includes Steps 2, 3, and 4, corresponds to Step 3 of FIG. 10. At the same time, device/main-circuit design is started in Step 5, and in Step 6, a semiconductor device structure and a wiring structure, which determine the behavior of the semiconductor device and the circuit, are determined. In Steps 7 and 8 subsequent thereto, true parameters, which are semiconductor device parameters, and extrinsic parameters, which are circuit parasitic parameters, are individually determined. A section 14 of FIG. 16, which includes Steps 6, 7, and 8 corresponds to Step 7 of FIG. 10. In Step 9, a true energy is calculated experimentally or theoretically, and in Step 10, an extrinsic energy is calculated experimentally or theoretically. The semiconductor device over-voltage and the semiconductor device loss are calculated by making use of the above-mentioned parameters of control/drive design and the true energy and the extrinsic energy of the device/main-circuit design obtained in Steps 9 and 10. The semiconductor device over-voltage and the semiconductor device loss are obtained through theoretical calculation or experimental measurement.

Figure 17:
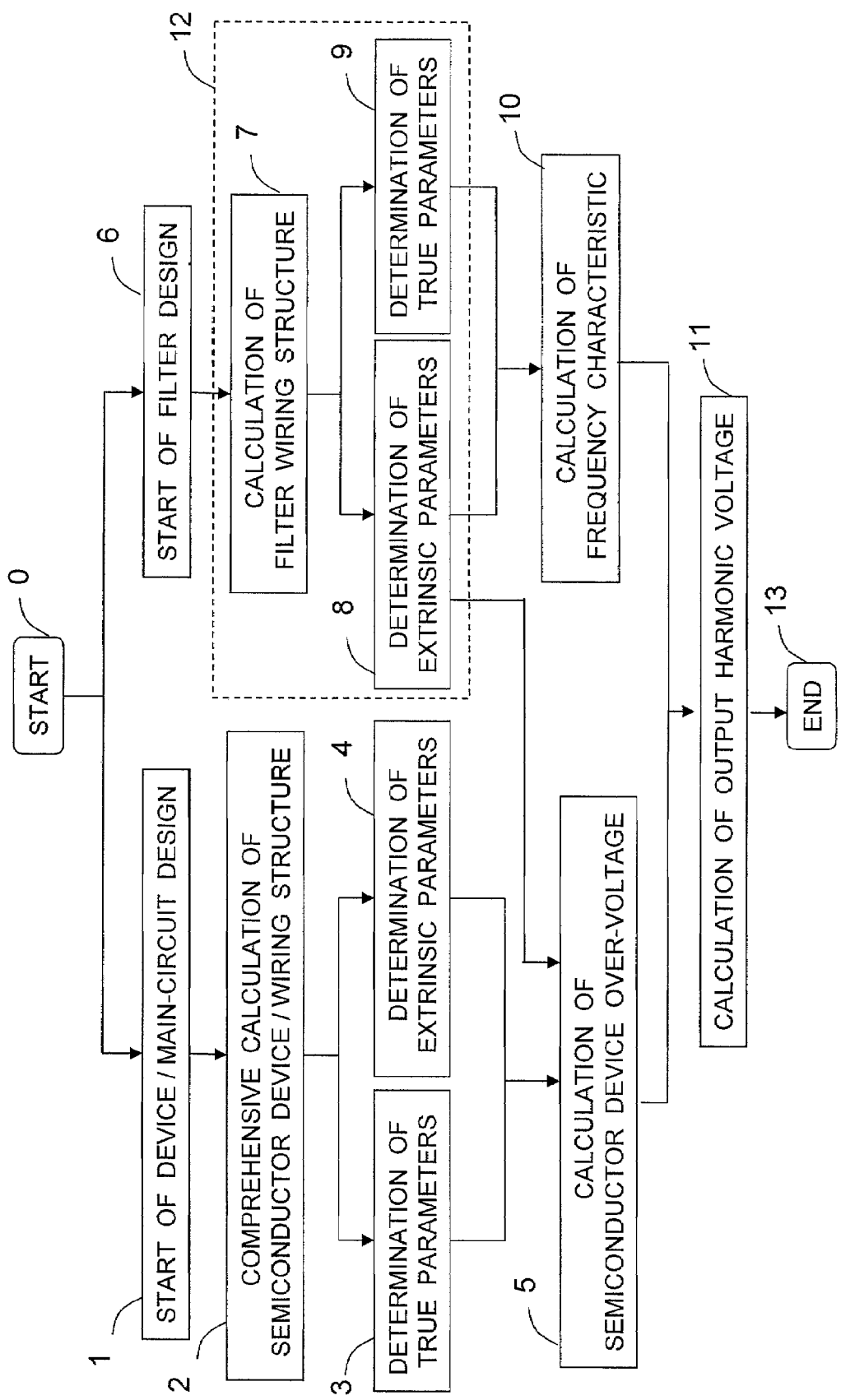

FIG. 17 is a flowchart for performing Step 13 of FIG. 10. While attention is paid to the device/main-circuit design parameters and the filter design parameters, the relations between the device/main-circuit design parameters and the filter parameters and the output harmonic voltage output from the converter to the load side are quantified. Steps 1, 2, 3, and 4 for device/main-circuit design are identical to those in FIG. 16. At the same time, filter design is started in Step 6, and, in Step 7 for calculation of filter wring structure, a magnetic material and a wiring structure which determine the frequency characteristic of the filter are determined. In Steps 8 and 9, the filter parameters are separated to true parameters of the magnetic material which determine the frequency characteristic of the filter, and extrinsic parameters stemming from the wiring structure, such as a manner of winding of a wire. A section 12 of FIG. 17, which includes Steps 7, 8, and 9, corresponds to Step 10 of FIG. 10. Subsequently, in Steps 5 and 10 of FIG. 17, the semiconductor device over-voltage and the filter frequency characteristic are calculated experimentally or theoretically by making use of the parameters of the device/main-circuit design and the true and extrinsic parameters of the filter design. In Step 11, the output harmonic voltage output from the converter to the load side is calculated. The output harmonics are obtained through calculation using simulation or experimental measurement.

Figure 18:
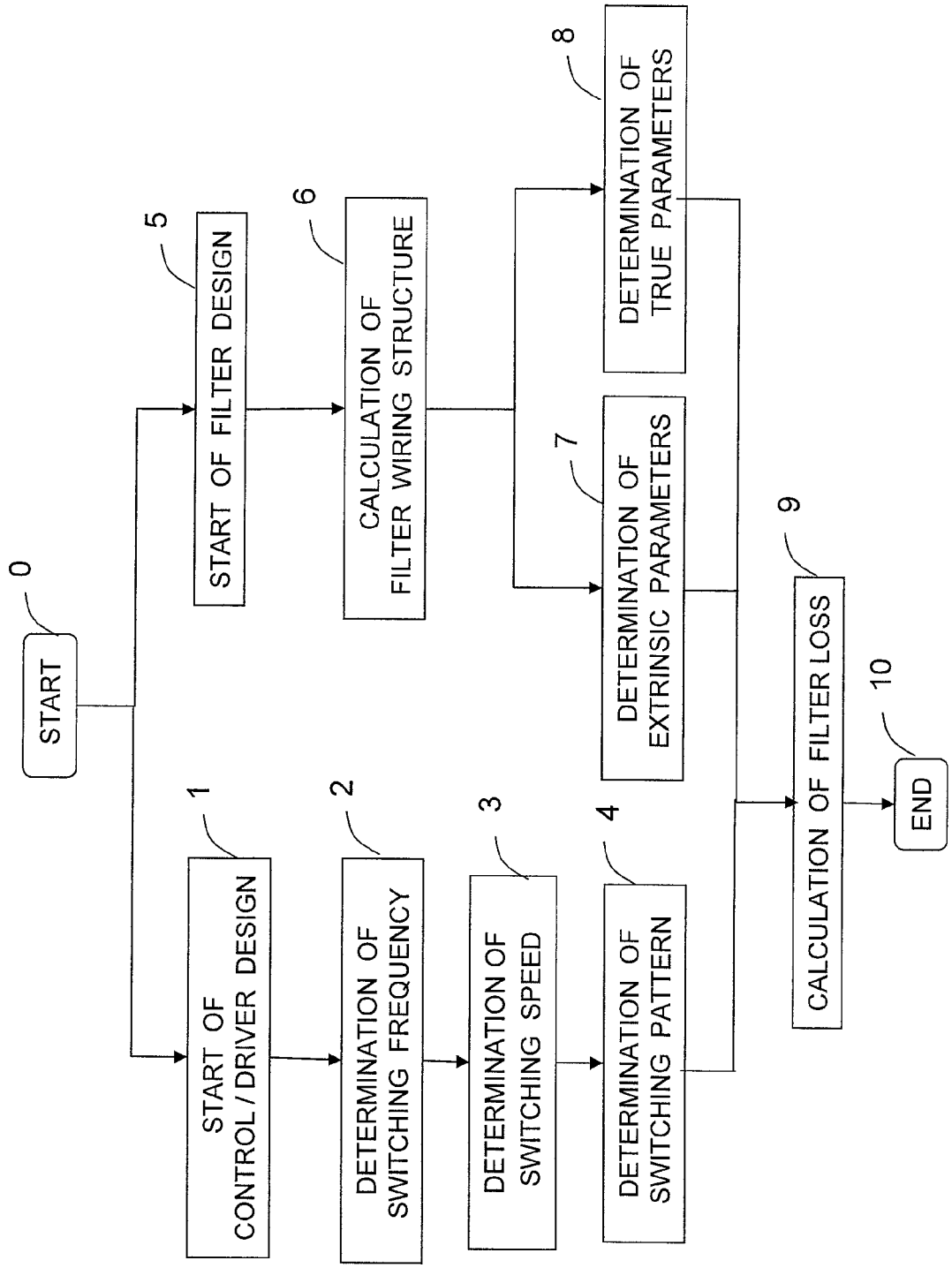

FIG. 18 is a flowchart for performing Step 14 of FIG. 10. While attention is paid to the control/driver design parameters and the filter design parameters, the relations between the control/driver design parameters and the filter parameters and the output noise output from the converter to the load side are quantified. Determination of the control/driver design parameters, and separation and determination of filter design parameters are the same as those described above. In Step 9, the loss of the filter is calculated by making use of the obtained parameter. The filter loss is obtained through calculation using simulation or experimental measurement.

Specific examples of the converter design shown in FIGS. 9 to 15 will be described. First, an experimental method for creating a database shown in FIG. 20 will be described (Example 1). Next, specific examples of quantification of interrelations shown in Steps 12, 13, and 14 of FIG. 10 will be described (Examples 2 and 3). Next, there will be described an example in which the parameter selection in Step 7 of FIGS. 11 to 15 and the structure design and electromagnetic design in Steps 9 and 10 of FIGS. 11 to 15 are performed for a three-phase full-bridge inverter, which is a typical circuit configuration of the power converter (Example 4). An example of the conversion circuit thermal design of Step 12 of FIGS. 13, 14, and 15 is shown in Example 5. Finally, an example of the power density calculation of Step 16 of FIG. 15 and a fabrication example are shown in Example 6.

EXAMPLE 1

Figure 19:
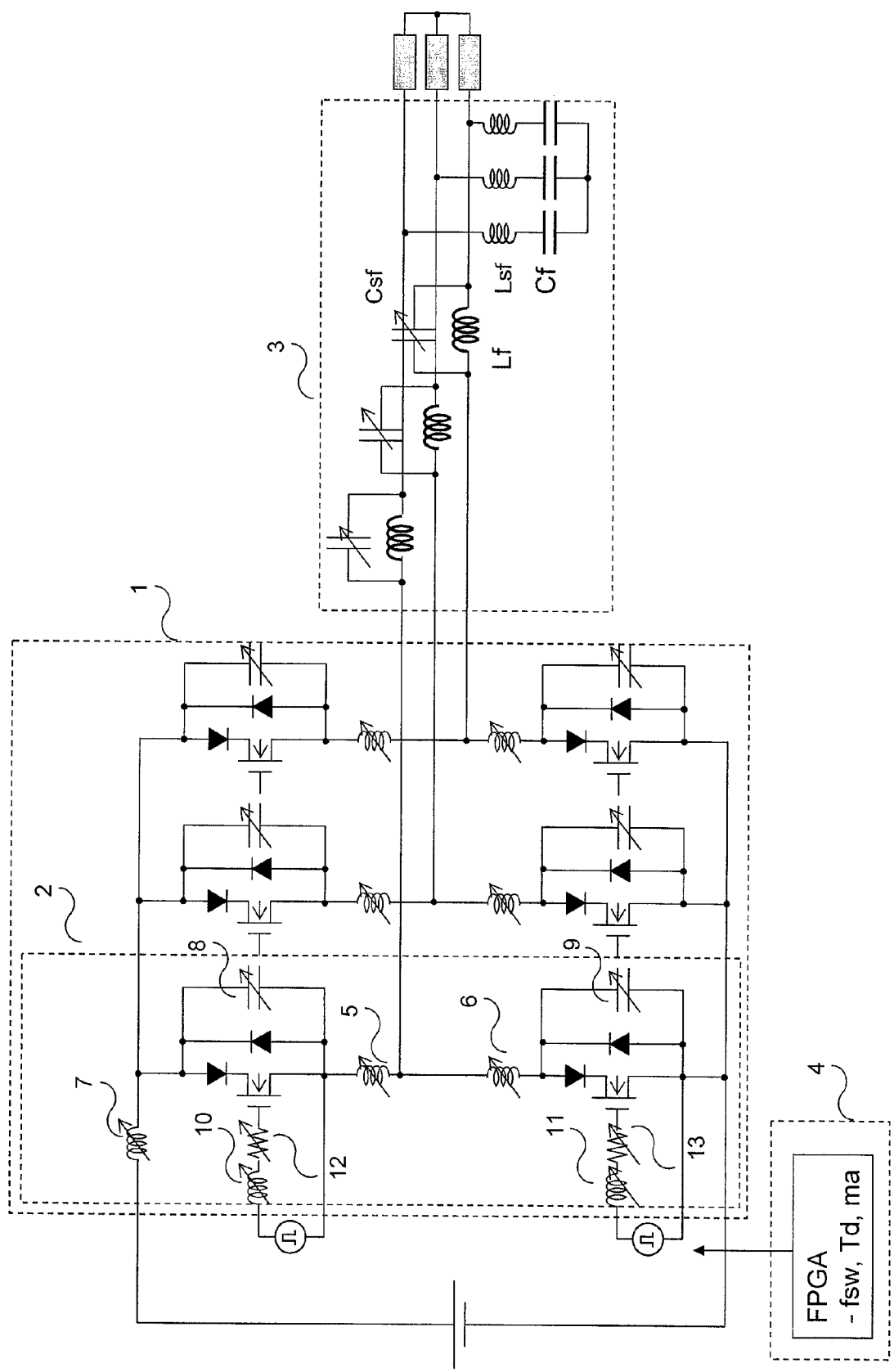
FIG. 19 is a diagram showing an equivalent circuit of a power converter evaluating/testing apparatus for the purpose of interrelation extraction.

FIG. 19 is an equivalent circuit of an experimental apparatus which has a three-phase full-bridge inverter configuration and which is used for quantification of interrelations of Steps 12, 13, and 14 of FIG. 10. This experimental circuit is composed of a three-phase full bridge circuit 1, which includes semiconductor devices and a wiring structure, a passive filter 3 composed of filter inductors and filter capacitors, and a control system 4. The three-phase full bridge circuit 1, which includes semiconductor devices and a wiring structure, is formed by connecting three single-phase half bridge circuits 2 in parallel. Each of the single-phase half bridge circuits 2 is composed of semiconductor devices, circuit parasitic inductances 5, 6, and 7, circuit parasitic capacitances 8 and 9, gate inductances 10 and 11, and gate resistances 12 and 13. The circuit parasitic inductances, the circuit parasitic capacitance, the gate inductances, and the gate resistances are realized by externally added variable components.

Figure 20:
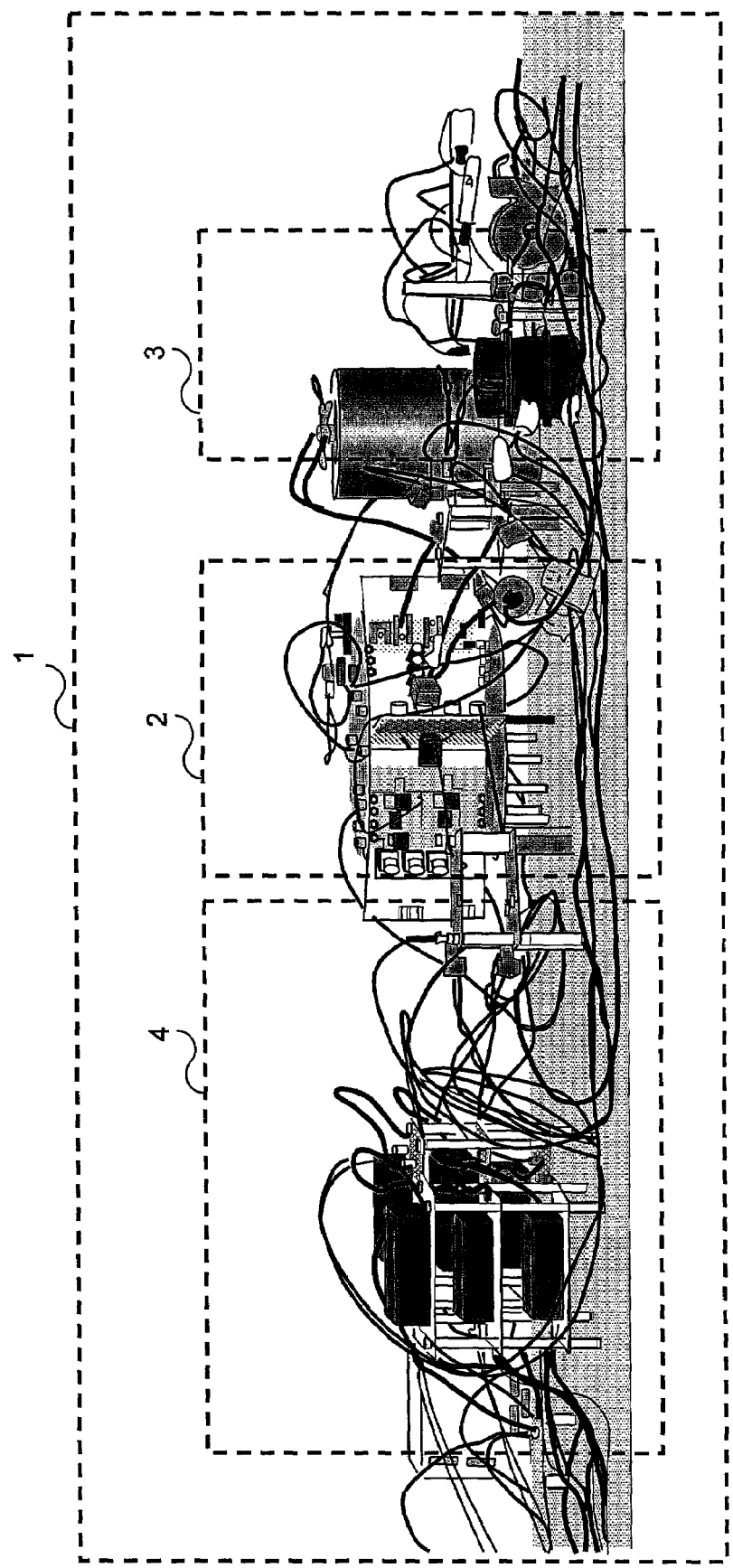
FIG. 20 is a diagram showing the power converter evaluating/testing apparatus for the purpose of interrelation extraction.

FIG. 20 shows an experimental apparatus which realizes the equivalent circuit shown in FIG. 19. The entire structure 1 of the experimental apparatus of FIG. 20 is composed of a circuit board 2 of FIG. 20 corresponding to the three-phase full bridge circuit 1 of FIG. 19, which includes semiconductor devices and a wiring structure; an LC filter 3 of FIG. 20 corresponding to the passive filter 3 of FIG. 19; and an FPGA control apparatus 4 of FIG. 20 corresponding to the control system 4 of FIG. 19.

Figure 21:
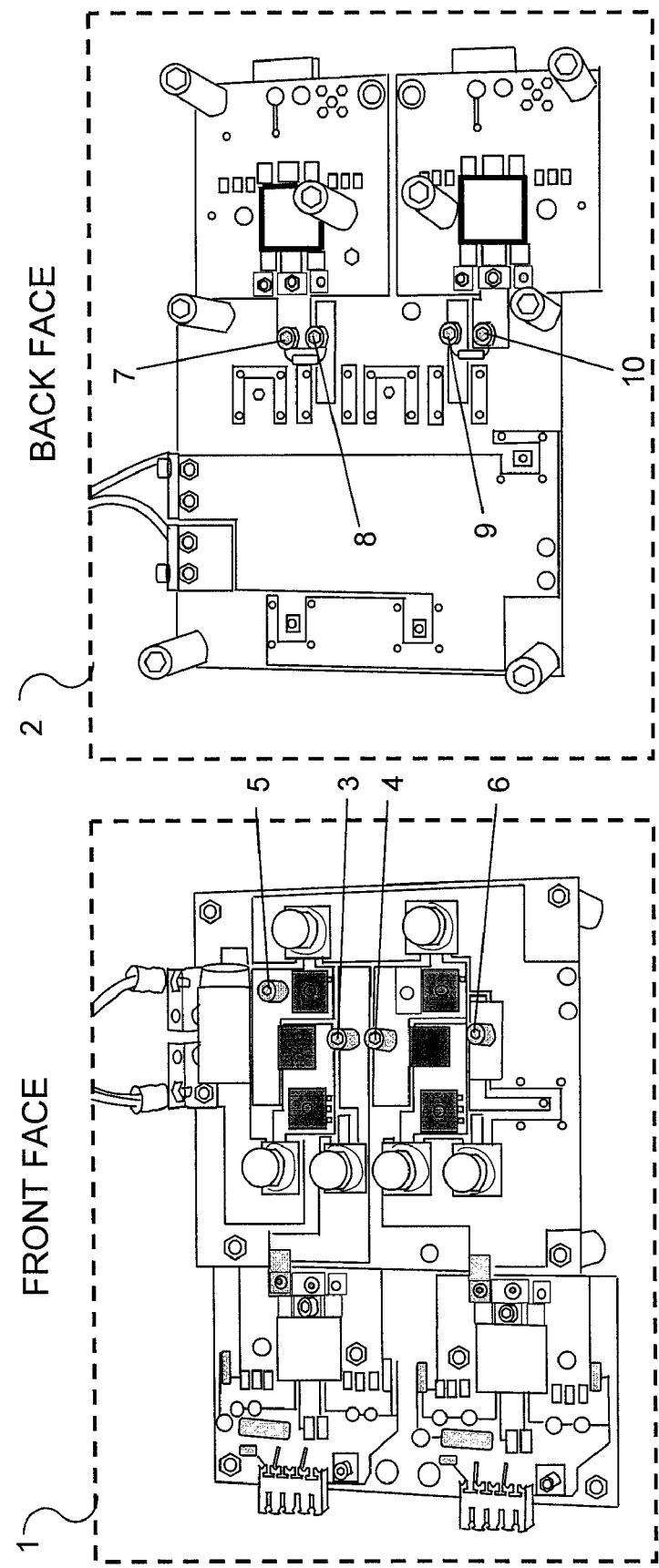
FIG. 21 is a diagram showing a parameter variable circuit board.

FIG. 21 shows the single-phase half bridge circuit 2 shown in FIG. 19, which corresponds to a single phase portion of the circuit board 2 of FIG. 20. The circuit parasitic inductances 5, 6, and 7 of FIG. 19 can be changed by adding an external inductance to terminals 3 and 4 of FIG. 21. The circuit parasitic capacitance 8 and 9 of FIG. 19 can be changed by adding external capacitances to terminals 3 and 5 and terminals 4 and 6 of FIG. 21. The gate inductances 10 and 11 and the gate resistances 12 and 13 of FIG. 19 can be changed by adding external resistances and inductances to terminals 7 and 8 and terminals 9 and 10 of FIG. 21, respectively. Through use of the above-described experimental apparatus, semiconductor device loss and semiconductor device over-voltage for arbitrary extrinsic parameters of the main circuit are measured experimentally.

EXAMPLE 2

Next, with reference to the experimental apparatus shown in FIG. 20, there will be described an example of quantification of the interrelation between the control/driver design and the device/main-circuit design which is performed in Step 12 of FIG. 10, which is a processing step for creating databases for power converter design. The semiconductor device loss and semiconductor device over-voltage greatly depend on switching frequency, switching speed, and switching pattern, which are control parameters, and circuit parasitic inductances and circuit parasitic capacitances, which are device/main-circuit parameters. The semiconductor device loss and semiconductor device over-voltage are obtained through simulation or experimentally.

Figure 22:
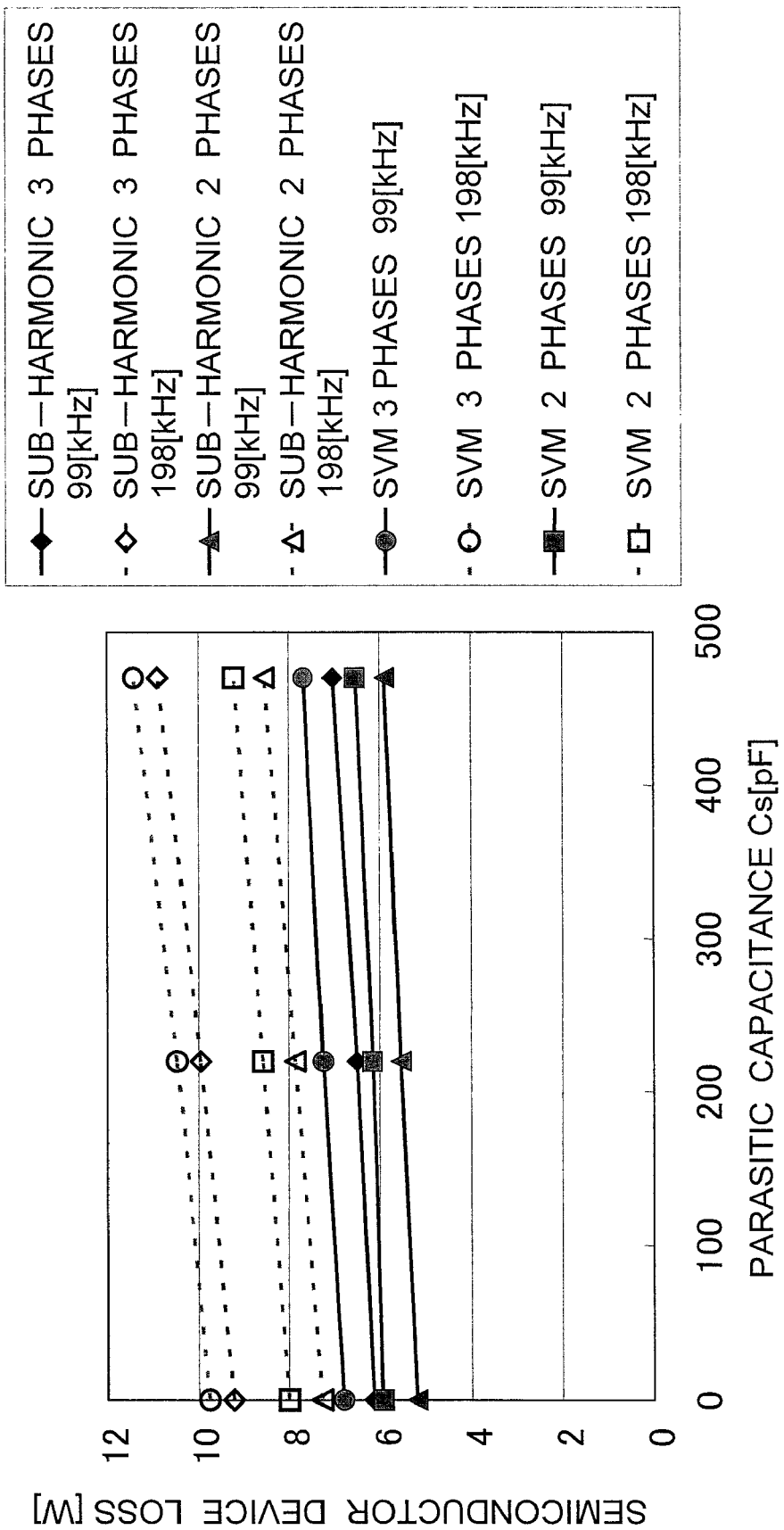
FIG. 22 is a graph showing an example interrelation between the control/drive and the device/main circuit.

FIG. 22 is an example of quantification of the interrelation between the control/driver design and the device/main-circuit design which is performed in Step 12 of FIG. 10. The semiconductor device loss was measured, while the switching frequency and the switching pattern were changed as control parameters, and the circuit parasitic capacitance was changed as a device/main-circuit parameter. The graph of FIG. 22 shows the results of the measurement. The horizontal axis represents the circuit parasitic capacitance, and the vertical axis represents the semiconductor device loss. The semiconductor device loss was measured, while the switching pattern (control parameter) was changed between a sub-harmonic modulation scheme and an SVM scheme, and the switching frequency was switched between 99 kHz and 198 kHz for each control scheme. The relations obtained through the measurement and shown in FIG. 22 are input to the design database, and used to obtain an allowable value of the parasitic capacitance when the converter is designed.

EXAMPLE 3

Figure 23:
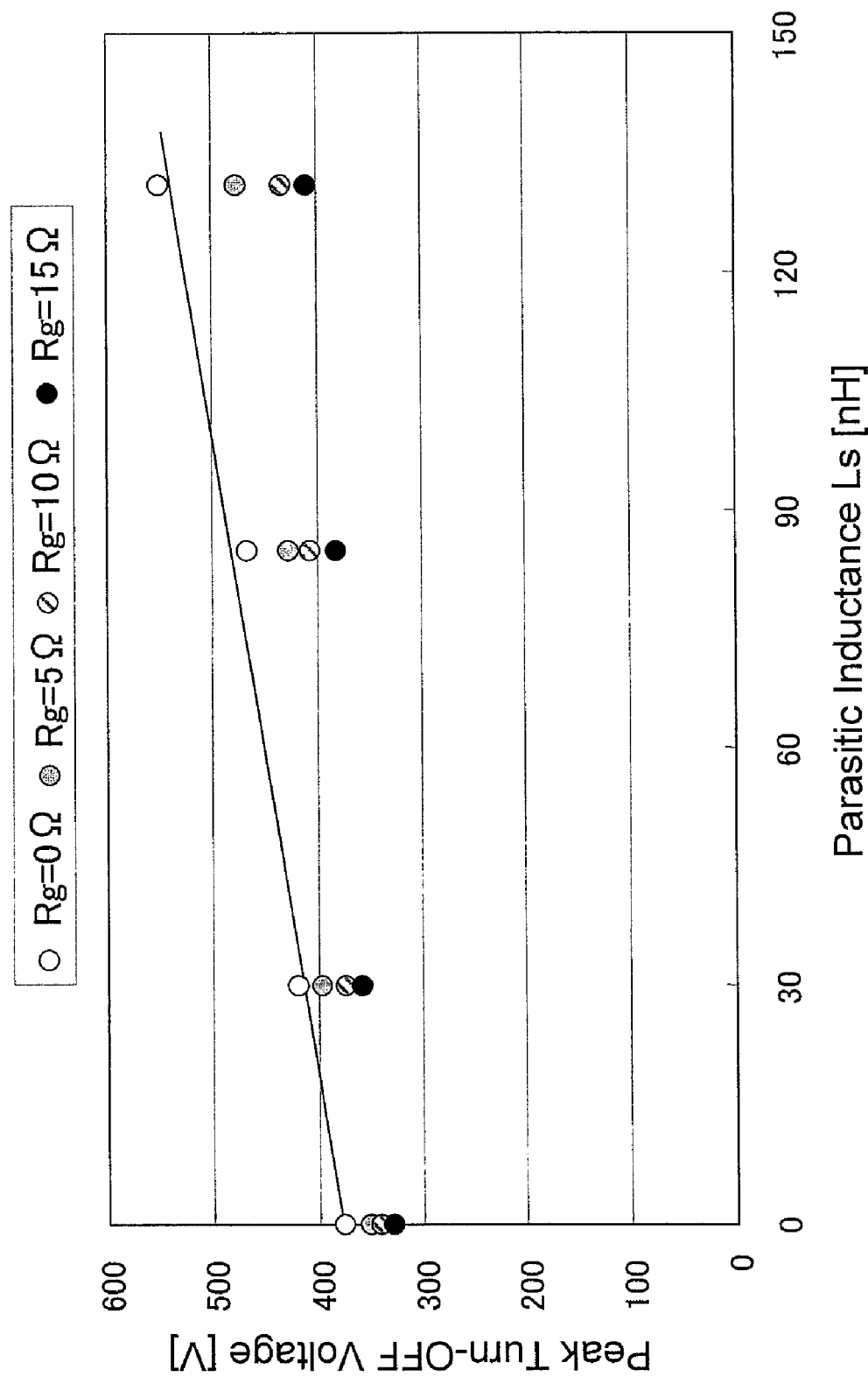
FIG. 23 is a graph showing the relation between circuit parasitic parameter and semiconductor device over-voltage.
Figure 24:
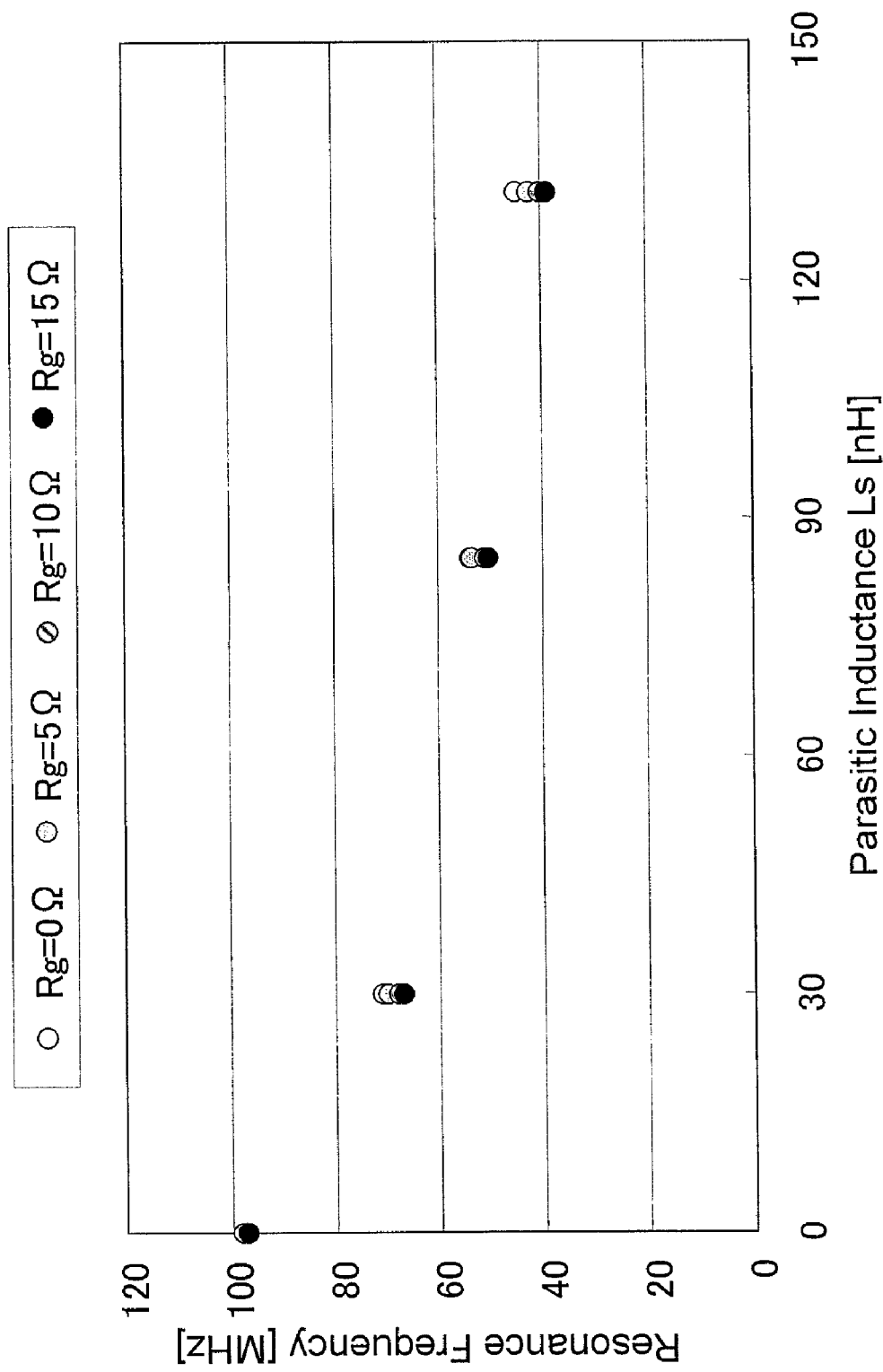
FIG. 24 is a graph showing the relation between the circuit parasitic parameter and the resonance frequency of the semiconductor device over-voltage.
Figure 25:
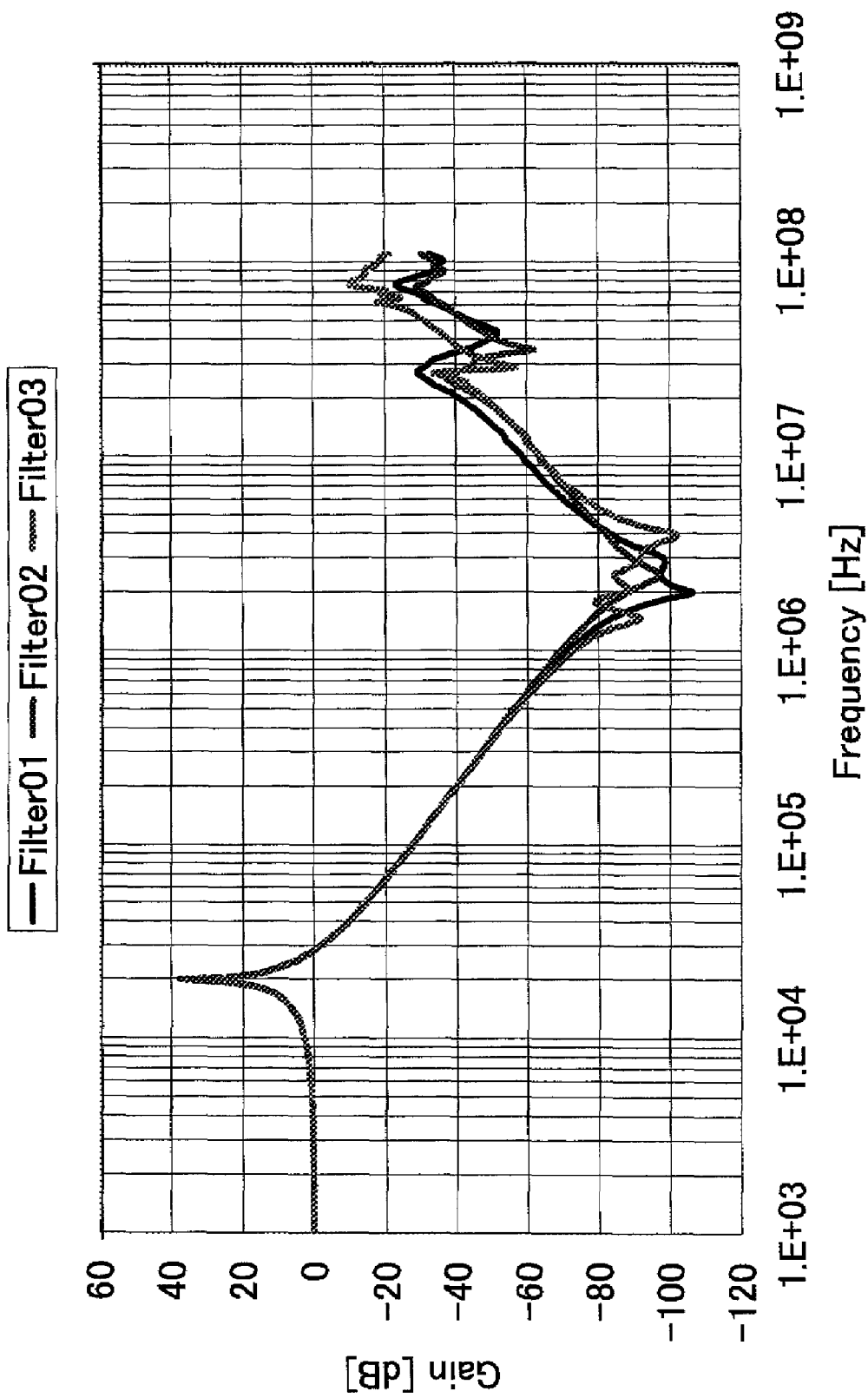
FIG. 25 is a graph showing the frequency characteristic of a filter.
Figure 26:
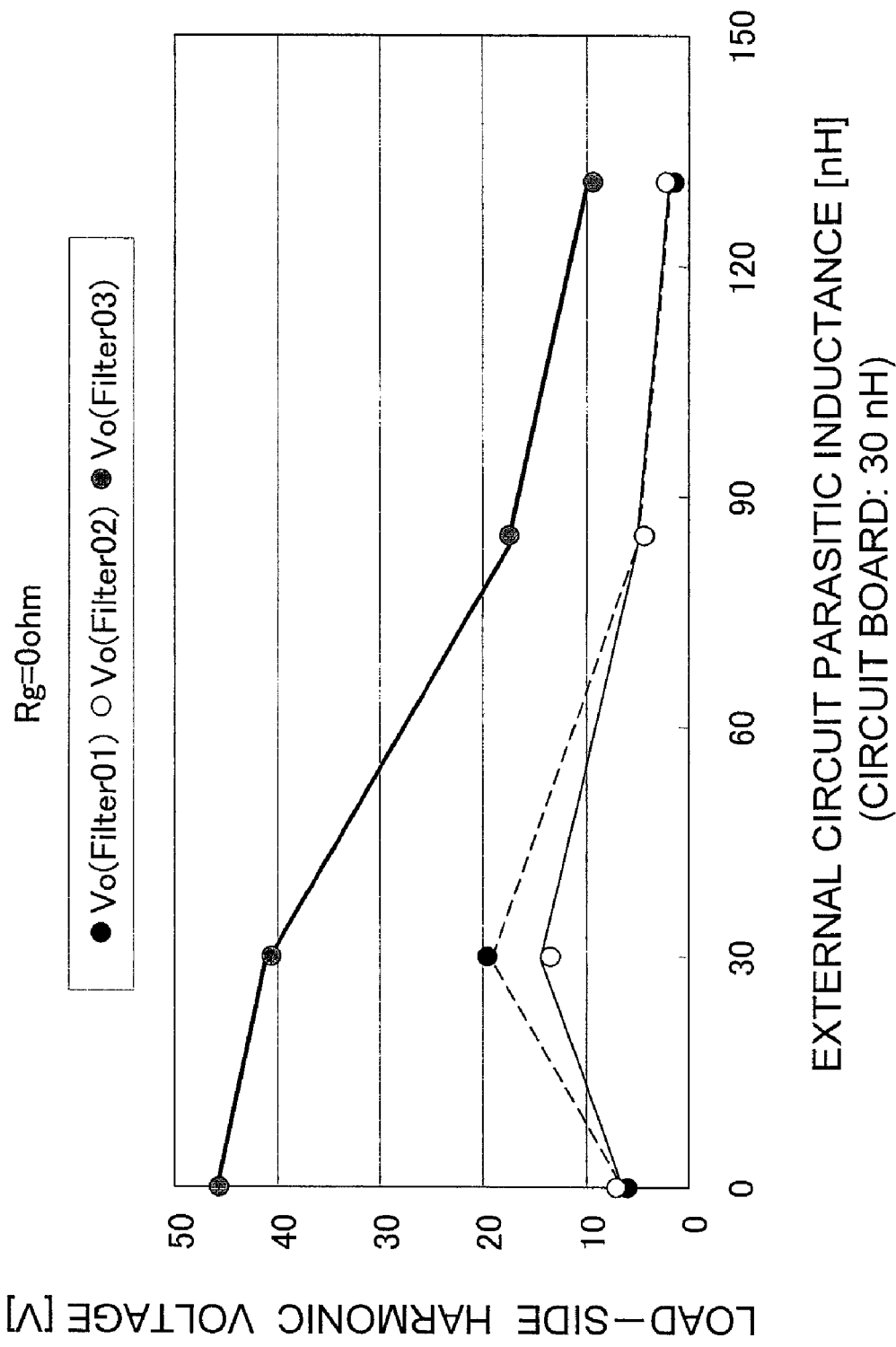
FIG. 26 is a graph showing output harmonic voltage after passage of the filter.

There will be described an example of quantification of the interrelation between the device/main-circuit design and the filter design which is performed in Step 13 of FIG. 10, which is a processing step for creating databases for power converter design. The semiconductor device over-voltage greatly depends on circuit parasitic parameters, and is experimentally measured by making use of the parameter-variable circuit board of FIGS. 19, 20, and 21. Meanwhile, the filter frequency characteristic can be experimentally measured by making use of an existing measurement apparatus such as an impedance analyzer. Therefore, noise which appears on the load side as a result of passage of semiconductor device over-voltage through the filter can be experimentally measured for arbitrary circuit parameters. FIG. 23 shows the semiconductor device over-voltage for the case where the circuit parasitic inductance was changed. The horizontal axis represents the circuit parasitic inductance, and the vertical axis represents the semiconductor device over-voltage. FIG. 24 is a graph related to FIG. 23. In FIG. 24, the vertical axis represents the frequency components of the semiconductor device over-voltage rather than the semiconductor device over-voltage itself. FIG. 25 shows frequency characteristics of three filters which have the same inductance but differ in the manner of winding. FIG. 25 demonstrates that the three filters have different frequency characteristics because they differ in parasitic parameters stemming from the wiring structure. FIG. 26 shows output harmonic voltages which appear on the load side when semiconductor device over-voltages of FIG. 23 pass through the filters having frequency characteristics shown in FIG. 25.

FIGS. 23, 24, and 26 represent changes in semiconductor device over-voltage and output harmonic voltage with a change in the circuit parasitic inductance, and show that the circuit parasitic inductance affects the converter design. The above-described results are input to the design database 15 of FIG. 10, and are used for calculation of the parasitic inductance allowable value for satisfying the target specifications.

EXAMPLE 4

Figure 27:
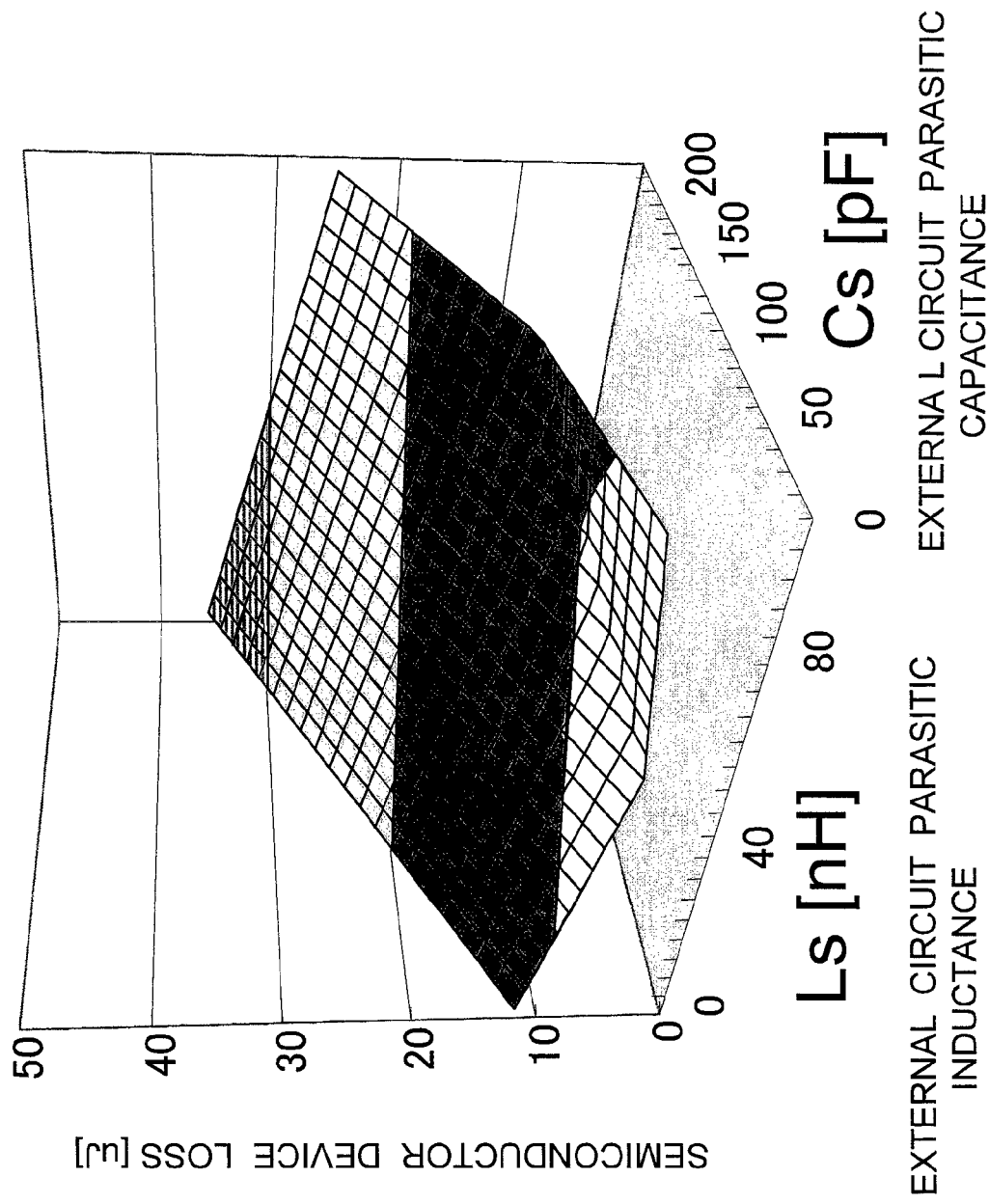
FIG. 27 is a graph showing the relation between circuit parasitic parameter and semiconductor device loss.

The results obtained in the above-described Examples 1, 2, and 3 are input to the design database in Step 15 of FIG. 10, to thereby crate a database for estimating the semiconductor device loss, the semiconductor device over-voltage, the filter loss, and the output harmonic voltage for arbitrary control/driver design parameters, device/main-circuit parameters, and the filter design parameters. The thus-created database is used at the design database 6 of FIGS. 11 to 15. FIG. 27 shows an example of the created database. FIG. 27 shows a change in the semiconductor device loss when the parasitic inductance and the parasitic capacitance are changed as parameters with the control parameters and the filter parameters being fixed. FIG. 27 shows that the semiconductor device loss becomes the minimum when the externally added parasitic inductance is 40 nH and the externally added parasitic capacitance is 0 pF.

EXAMPLE 5

After completion of the above-described electric circuit design, mechanical design is performed. An example of the structure design and electromagnetic design shown in Steps 12 and 13 of FIGS. 12 to 15 will be described. First, the allowable values of the parasitic inductance and the parasitic capacitance, which are extrinsic parameters stemming from the wiring structure of the circuit, which is the final target of the structure design, are selected from the target specifications.

Figure 28:
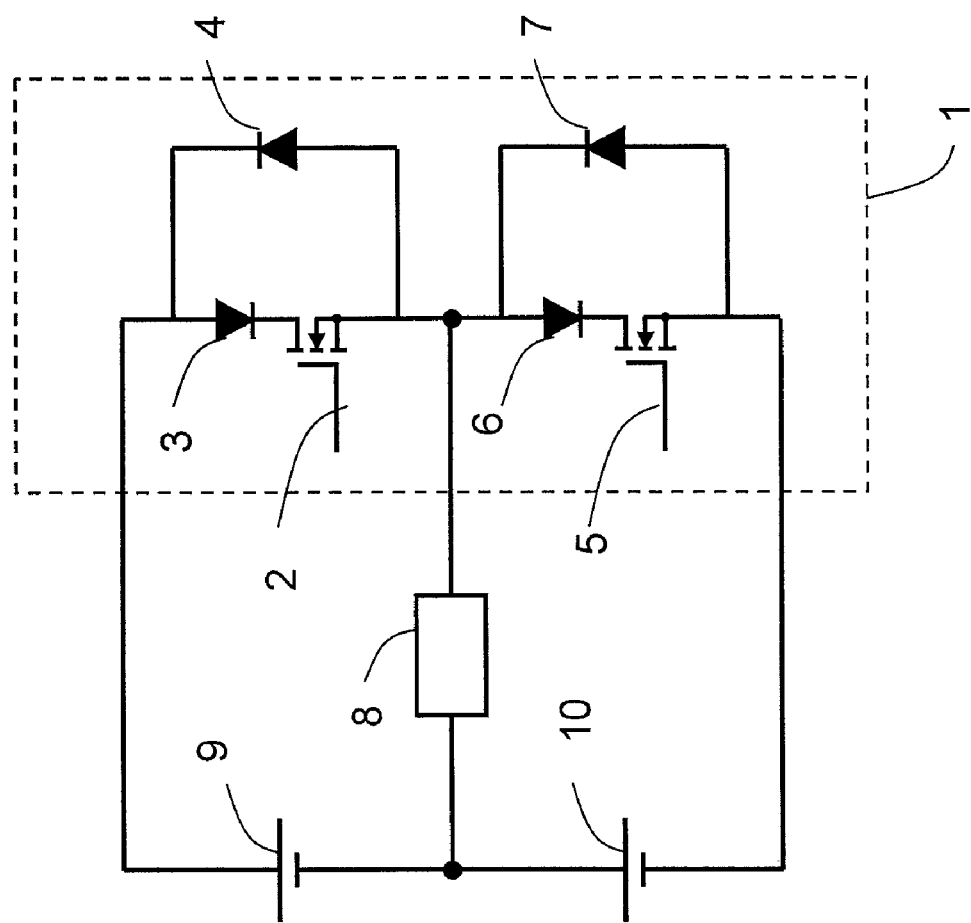
FIG. 28 is a diagram showing an equivalent circuit of a three-phase inverter.
Figure 29:
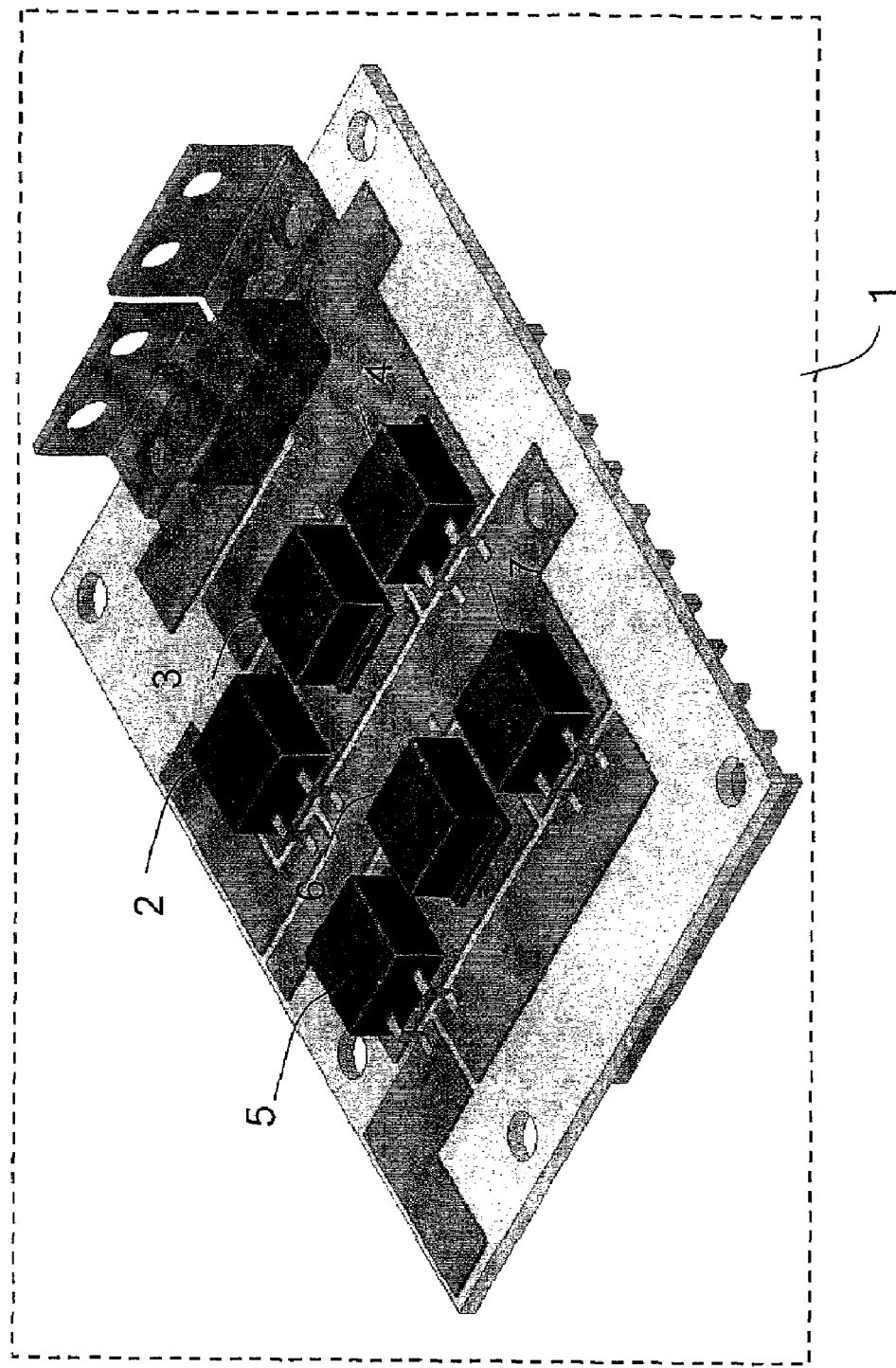
FIG. 29 is a view showing the structure design of the three-phase inverter.

FIG. 28 is an equivalent circuit of a single-phase portion of a three-phase inverter. In FIG. 28, reference numeral 1 denotes a power conversion section for which thermal design is performed, and which is composed of MOSFETs 2 and 5, which serve as main switching semiconductor devices, diodes 3 and 6 for canceling the internal diodes of the MOSFETs, and inverse parallel diodes 4 and 7. FIG. 29 is a view obtained by drawing the equivalent circuit of FIG. 28 by use of a CAD software program. In FIG. 29, reference numeral 1 denotes a power conversion section for which thermal design is performed, and which is composed of MOSFETs 2 and 5, which serve as main switching semiconductor devices, diodes 3 and 6 for canceling the internal diodes of the MOSFETs, and inverse parallel diodes 4 and 7.

Figure 30:
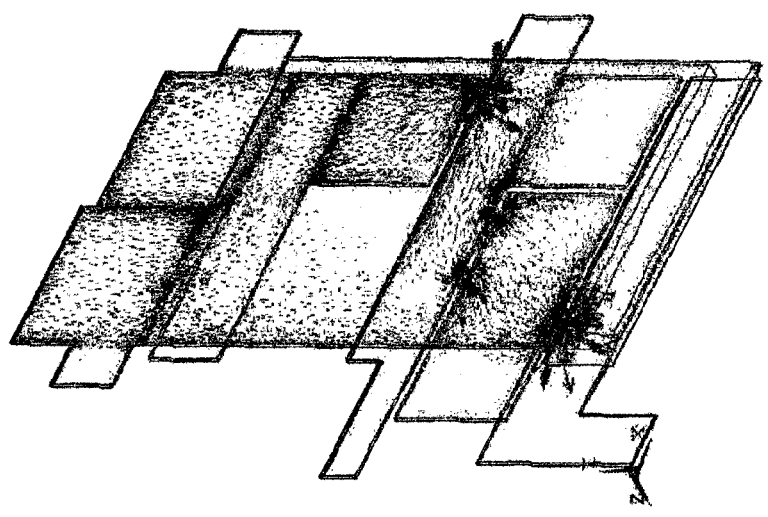
FIG. 30 is a view showing the conversion circuit electromagnetic design of the three-phase inverter.

In Step 13 of FIGS. 12 to 15 for conversion circuit electromagnetic design, the parasitic inductances and parasitic capacitance of the wiring structure of the structure body for which the structure design has been performed are analyzed. The analysis is performed by use of an analysis formula or through simulation. Here, there will be described an example in which the parasitic inductance is estimated through simulation. FIG. 30 shows the results of the conversion circuit electromagnetic design. In FIG. 30, corresponding to FIG. 29, copper patters through which current flows and wire bodings used for connecting semiconductor devices to the board are extracted. In the simulation of FIG. 30, current flowing through the copper patters is determined, and a magnetic field generated by the current is calculated, to thereby calculate the parasitic inductance. The calculated parasitic inductance was 17 nH. Similarly, the parasitic capacitance is calculated through calculation of an electric field. The calculated parasitic capacitance was 32 pF. When these values are equal to the values selected in Step 7 for circuit parameter selection, thermal design is then performed. When these values are not equal to the values selected in Step 7 for circuit parameter selection, the structure design and the electromagnetic design are performed again.

EXAMPLE 6

Next, thermal design for the power converter to which the present invention is applied will be described with reference to the drawings. As shown in the flowcharts of FIGS. 12 to 15, the total loss of the conversion circuit, etc., are calculated by making use of the design database 7 of FIGS. 12 to 15, and parameters which are determined in Step 8 to satisfy the target specifications are selected. When the selected parameters, which are determined in Step 8 to satisfy the target specifications, satisfy the allowable values of the semiconductor device loss, the filter loss, the output harmonic voltage, etc., the structure design and the electromagnetic design of Steps 9 and 10 are performed so as to perform the mechanical design of the structure body which satisfies the extrinsic parameters selected at Step 7 and stemming from the wiring structure. When the extrinsic parameters calculated in Steps 9 and 10 satisfy the parameters selected in Step 7, in Step 12 for conversion circuit thermal design, the thermal design of the power converter is performed by use of the loss obtained from the semiconductor device loss and the filter loss obtained in Step 6. In the conversion circuit thermal design, the temperature of a semiconductor device used in the power conversion circuit is measured or calculated experimentally or through simulation, and a cooling unit is designed so that the temperature of the semiconductor device becomes equal to an allowable temperature or lower. When the cooling unit designed in Step 12 for conversion circuit thermal design can maintain the semiconductor device at the allowable temperature or lower, Step 14 of FIGS. 14 and 15 for volume calculation is performed. When the designed cooling unit cannot maintain the semiconductor device at the allowable temperature or lower, Step 12 for conversion circuit thermal design is performed again.

An example of the conversion circuit thermal design will be described. Thermal design is performed for a single-phase portion of the three-phase inverter of FIGS. 28 and 29. The conversion circuit is assumed to have the following specifications.

Single-phase capacity: 1 kW
DC voltage: 300 V
Switching frequency: 200 kHz

Figure 31:
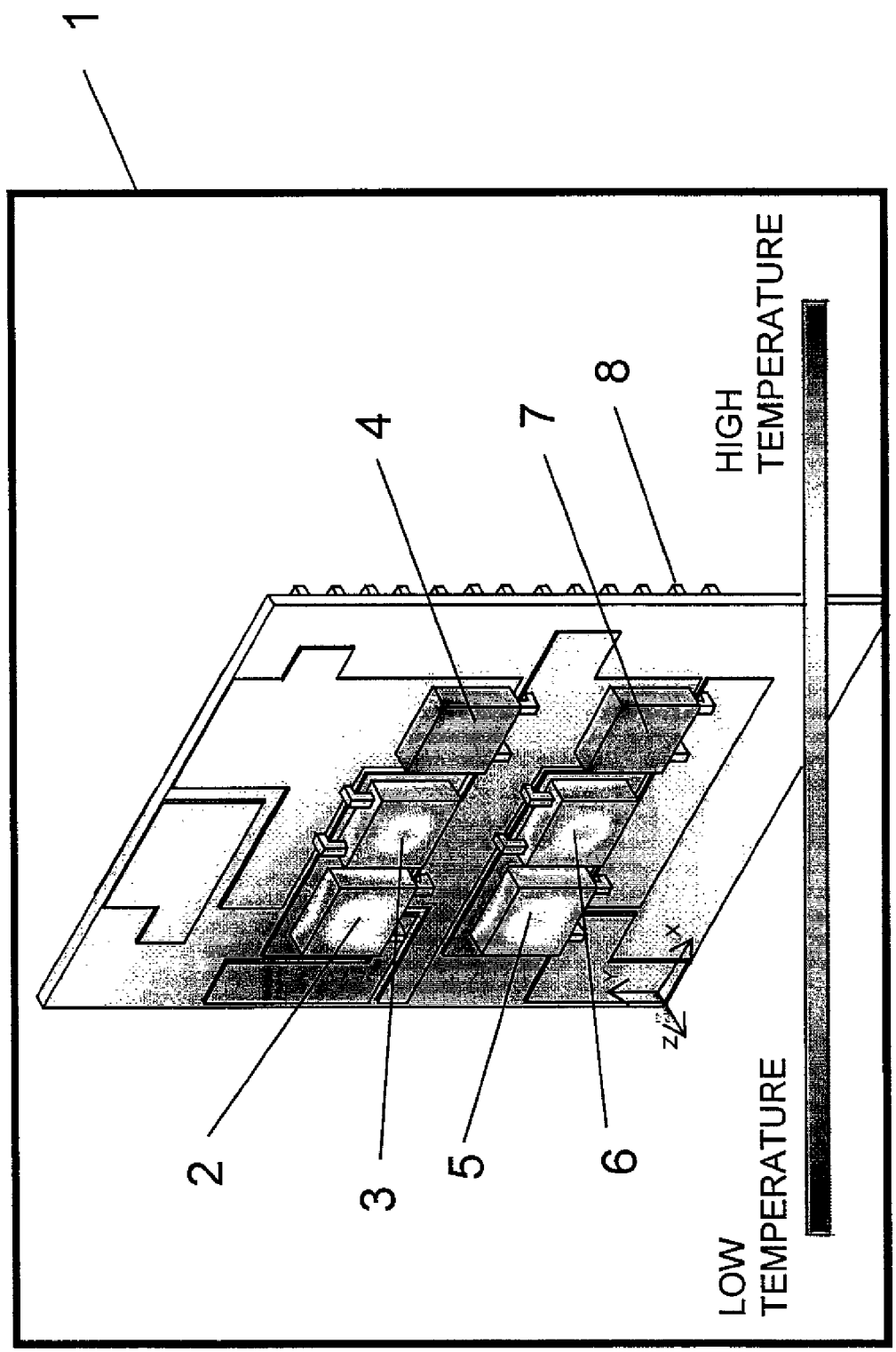
FIG. 31 is a diagram showing a thermal design of a power converter and its temperature distribution.

FIG. 31 shows the temperature distribution of the inverter of FIGS. 28 and 29 for which thermal design was performed. Heat generated by each semiconductor device is obtained from the design database 6 of FIGS. 11 to 15. Under the conditions of single-phase 1 kW, 300 V, and 200 kHz, the loss of each MOSFET shown in FIGS. 28 and 29 is 18 W, the loss of each diode shown in FIGS. 28 and 29 is 2 W, and the loss of each inversion-parallel diode shown in FIGS. 28 and 29 is 1 W. Section 1 of FIG. 31 shows the structures of the circuit board and the semiconductor devices of the electric circuit denoted by reference numeral 1 in FIGS. 28 and 29. The circuit board is designed by the structure design of Step 9 on the basis of the parameters selected in Step 7 of FIGS. 11 to 15. Reference numerals 2 and 5 in FIG. 31 denote MOSFETs, which serve as main switching semiconductor devices. Reference numerals 3 and 6 in FIG. 31 denote diodes for canceling the internal diodes of the MOSFETs. Reference numerals 4 and 7 in FIG. 31 denote inverse parallel diodes. Reference numeral 8 in FIG. 31 denotes a cooling unit which is a component to be designed. This cooling unit is designed so that the temperature of each of the semiconductor devices 2, 3, 4, 5, 6, and 7 of FIG. 31 is maintained at 125° C., which is the allowable temperature, or lower. After the thermal design of the conversion circuit is performed in the above-described steps, the volume calculation and the OPD calculation as described below are performed.

In the volume calculation 14 shown in FIGS. 14 and 15, the sum of the volumes of the filter and the cooling unit, which are major components which determine the volume of the power conversion circuit is calculated from the cooling unit volume obtained in Step 12 for conversion circuit thermal design and the filter volume obtained from the design database 6. When it is determined in Step 15 for determining the volume condition that the sum of the filter volume and the cooling unit volume obtained by the volume calculation 14 is equal to or less than the allowable value, the next step is performed. When the sum of the filter volume and the cooling unit volume obtained by the volume calculation 14 is greater than the allowable value, the design operation or work returns to a point immediately before Steps 3, 4, and 5 of FIGS. 14 and 15 for parameter determination, and the design operation is performed again. In Step 16 of FIG. 15, the total volume of the power conversion circuit, including conversion circuit components other than the filter volume and the cooling unit volume, is calculated with reference to the database 17, and the output power density (OPD) of the power conversion circuit is calculated by dividing the output power of the power conversion circuit by the total volume of the power conversion circuit. An example of Step 18 of FIG. 15 for OPD calculation will be described.

Figure 32:
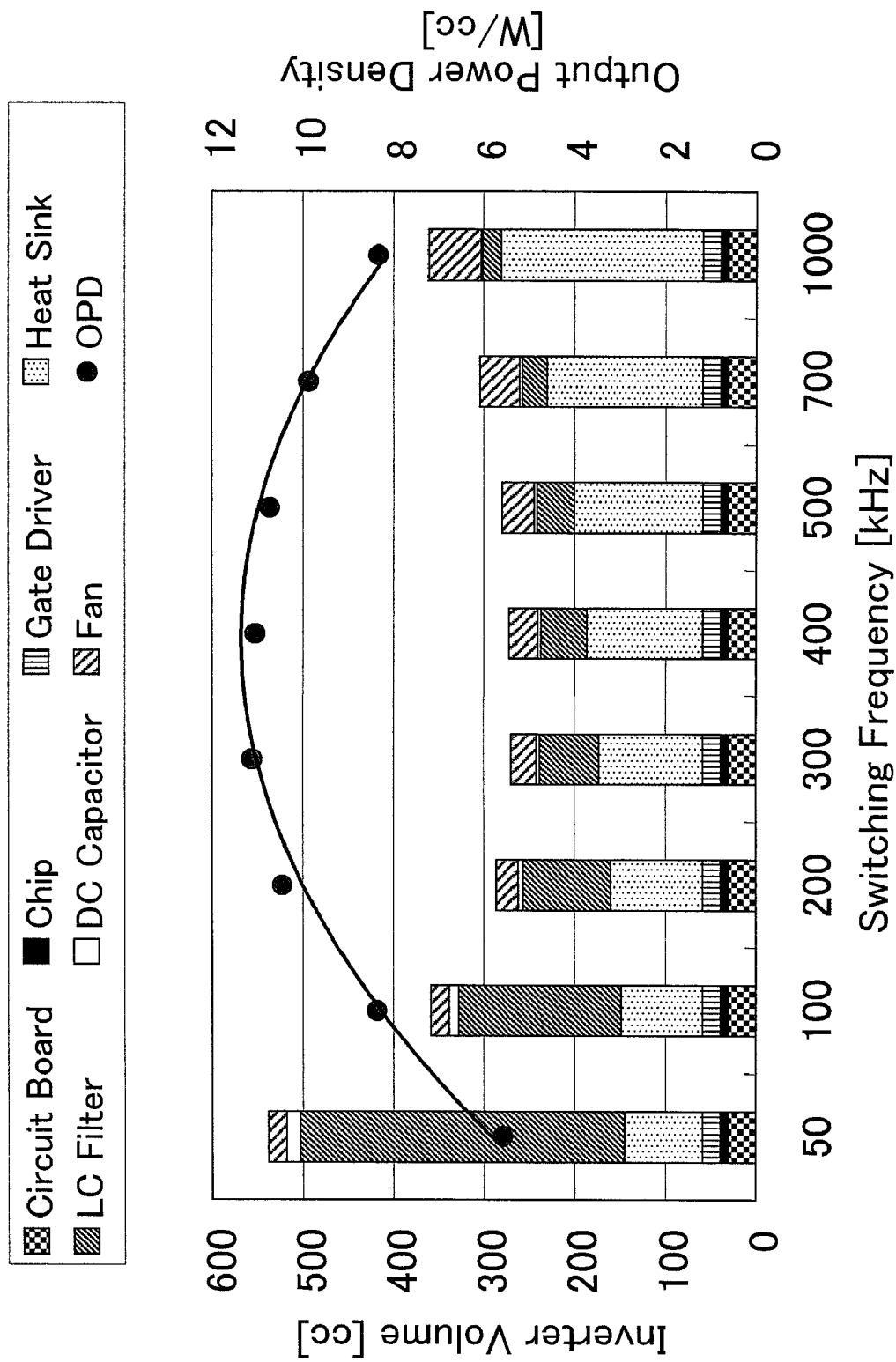
FIG. 32 is a graph showing an example calculation of converter OPD according to the flowchart of the present invention.

An example method for OPD calculation will be described with reference to FIG. 32. FIG. 32 shows a change in the converter volume when the switching frequency was changed with the output capacity of the power converter being fixed to three-phase 3 kW and the DC voltage being fixed to 300 V. "Circuit Board" in FIG. 32 shows the volume of a circuit board; "Chip" shows the volume of semiconductor devices; "Gate Driver" shows the volume of a gate driver IC; "Heat Sink" shows the volume of a cooling unit which was obtained in Step 12 of FIGS. 12 to 14 for conversion circuit thermal design; "LC filter" shows the volume of an LC filter which was obtained in Step 15 of FIG. 10 for creating the database or Step 6 of FIGS. 11 to 15; and "FAN" shows the volume of a fan used for cooling. The volumes of other converter components are obtained from data sheets or the like. The filter volume and the cooling unit volume at each frequency are calculated for each frequency in accordance with the flowcharts of FIGS. 11 to 15. The OPD at each frequency is calculated by dividing the output capacity of the converter by the total sum of volumes of the components of the conversion circuit. From FIG. 32, the optimal operating frequency at which the maximum power density is attained can be obtained. The present calculation example shows that a converter having a volume of 90 cc for per phase and a power density of 11 W/cc can be realized at a switching frequency of 200 kHz to 300 kHz.

Figure 33:
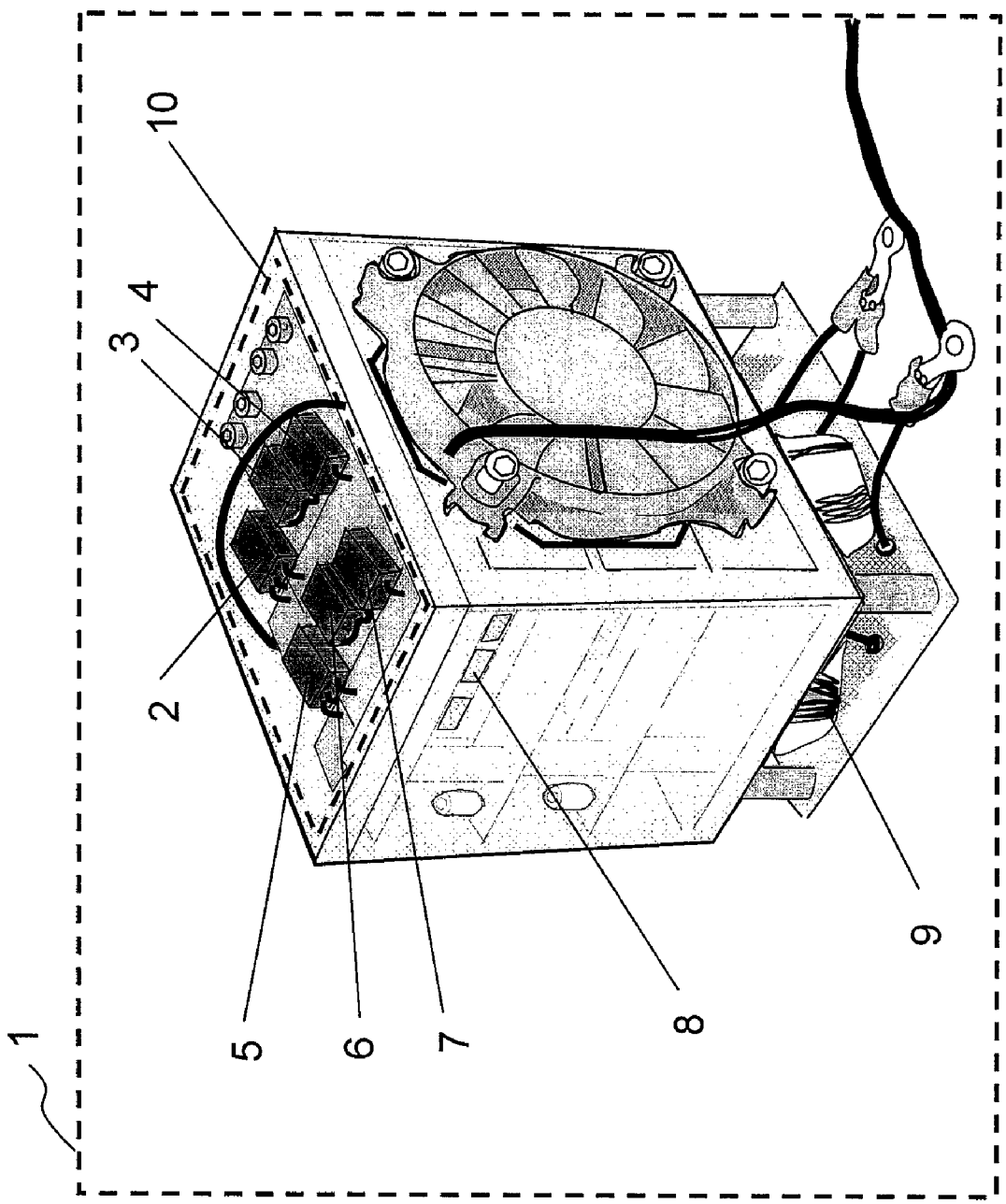
FIG. 33 is a view showing the appearance of a prototype of the power converter.
Figure 34:
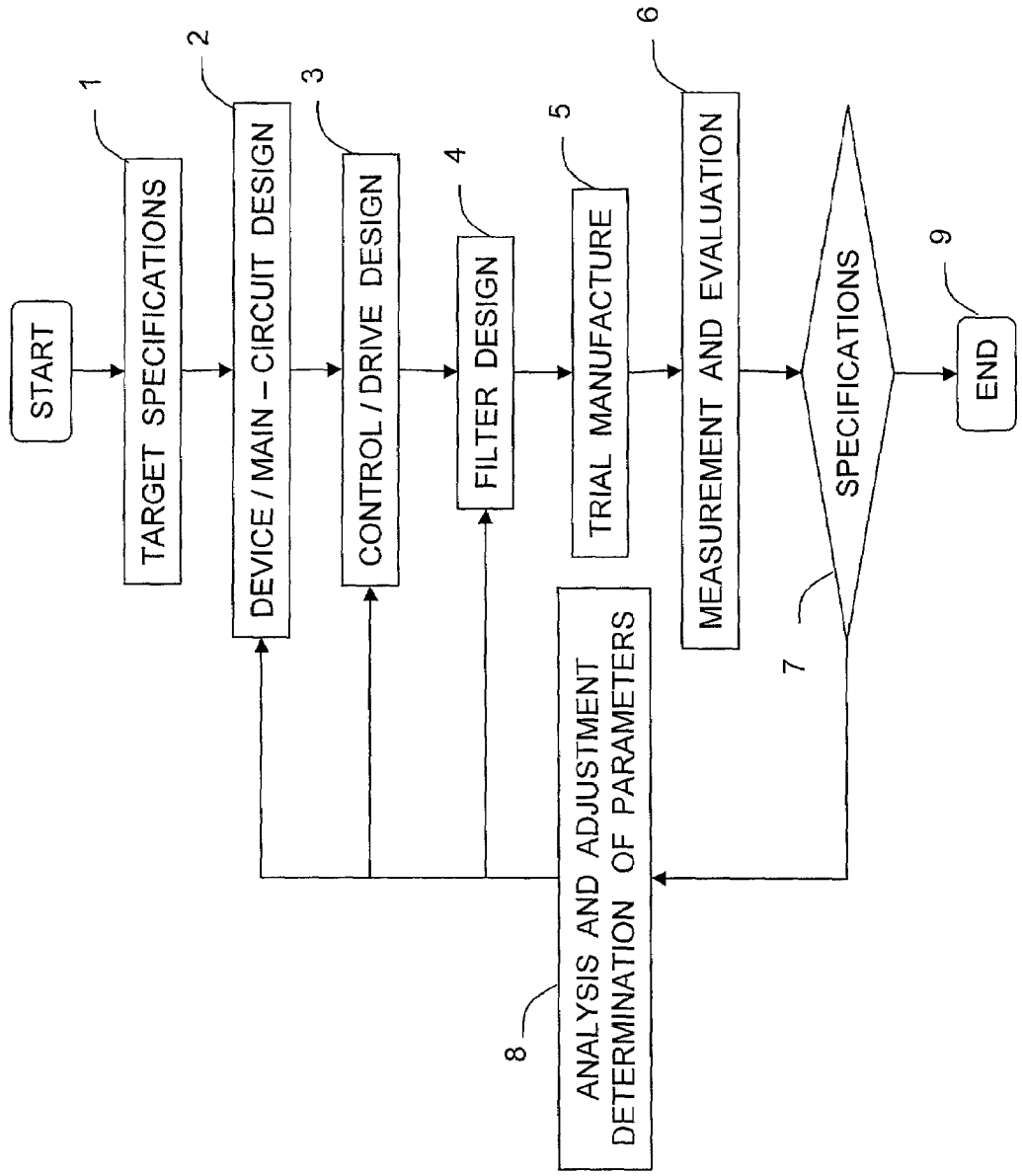
FIG. 34 is a flowchart showing a conventional power converter design method.

FIG. 33 shows a prototype of the three-phase converter fabricated on the basis of the results obtained in FIG. 32. The prototype has specifications of output capacity: three-phase 3 kW, DC voltage: 300 V, and switching frequency: 200 kHz. FIG. 33 shows the appearance of the three-phase inverter, and an each portion corresponding to a single phase is composed of MOSFETs 2 and 5, diodes 3 and 6 for canceling the internal diodes of the MOSFETs, inverse-parallel diodes 4 and 7, a cooling unit 8, and a filter 9. A section 10 of FIG. 33 corresponds to FIGS. 29, 30, and 31 for which the structure design, the electromagnetic design, and the thermal design were performed. The volumes of the semiconductor devices 2, 3, 4, 5, 6, and 7, the cooling unit 8, and the filter 9 shown in FIG. 33 are equal to the volumes of FIG. 32. Therefore, the validity of the example method for calculating the OPD of the converter can be shown.

What is claimed is:

1. A method of designing a power converter comprising the steps of:

determining specifications of the power converter, including electrical specifications and a circuit configuration;

determining circuit parameter values for realizing the electrical specifications and the circuit configuration;

determining a semiconductor device which is used for realizing the determined electrical specifications and circuit configuration;

determining an equivalent circuit of the determined semiconductor device;

extracting parameter values of the determined semiconductor device equivalent circuit as input data for calculating loss of the semiconductor device;

dividing the circuit parameter values into circuit parasitic parameter data and circuit basic parameter data, which serve as input data for calculating the loss of the semiconductor device;

supplying the semiconductor device equivalent circuit parameter data, the circuit parasitic parameter data, and the circuit basic parameter data to a semiconductor device loss model so as to calculate the loss of the semiconductor device;

determining whether or not a circuit loss optimal value has been achieved in consideration of previously prepared parameter data of components of the power conversion circuit, including control parameter data and filter parameter data;

again setting the circuit parasitic parameter values and creating the circuit parasitic parameter data when the circuit loss optimal value has not yet been achieved;

outputting, as design data, the semiconductor device loss and the circuit parasitic parameter values at that time when the circuit loss optimal value has been achieved; and designing the power converter by use of the optimized semiconductor device loss and circuit parasitic parameter values.

2. A method of designing a power converter according to claim 1, wherein the loss of the semiconductor device is calculated by the following semiconductor device loss model equation:

$$Ploss = a \cdot Ron \cdot IL^2 + (Esd + Ediode + ELs + ECs + Eon\text{-}t + Eoff\text{-}t) \cdot fsw$$

where

IL: load current of the power converter a: current conduction ratio of the switching semiconductor device determined by the specification of the power converter Ron: on resistance of the semiconductor device Esd: energy associated with charging and discharging of charge accumulated in the switching semiconductor device Ediode: energy associated with charging and discharging of charge accumulated in a diode device ELs: energy accumulated in a circuit parasitic inductance ECs: energy accumulated in a circuit parasitic capacitance Eon-t: switching energy determined by turn-on time Eoff-t: switching energy determined by turn-ff time fsw: switching frequency Ploss: the sum of conduction loss and switching loss of the switching device.

3. A method of designing a power converter according to claim 2, wherein, when the semiconductor device is a unipolar device, Esd and Ediode used for calculation of the semiconductor device loss are calculated by the following equations:

$$E_{sd} = \int_0^V C_{oss} \cdot v_{DS} \cdot dv_{DS}$$

$$E_{diode} = \int_0^V C_{diode} \cdot v_{diode} \cdot dv_{diode}$$

where

Coss: output capacitance of the switching device vDS: drain-source voltage of the switching device Cdiode: junction capacitance of the diode device vdiode: anode-cathode voltage of the diode device Vcc: input DC voltage of the power converter.

4. A method of designing a power converter according to claim 2, wherein, when the semiconductor device is a bipolar device, Esd and Ediode used for calculation of the semiconductor device loss are calculated by the following equations:

$$E_{sd} = \int_0^V Q_{sd-v} \cdot dv_{ce} + \int_0^{I_L} Q_{sd-i} \cdot di_{sd}$$

$$E_{diode} = \int_0^{V_L} Q_{diode-v} \cdot dv_{diode} + \int_0^{I_L} Q_{diode-i} \cdot di_{diode}$$

where
- Qsd-v: quantity of charge accumulated in the switching device and having voltage dependency
- Qsd-I: quantity of charge accumulated in the switching device and having current dependency
- vce: collector-emitter voltage of the switching device
- isd: collector current of the switching device
- Qdiode-v: quantity of charge accumulated in the diode device and having voltage dependency
- Qdiode-I: quantity of charge accumulated in the diode device and having current dependency
- vdiode: anode-cathode voltage of the diode device
- idiode: anode current of the diode device.

5. A method of designing a power converter according to claim 2, wherein ELs and ECs used for calculation of the semiconductor device loss are calculated by the following equations:

$$E_{Ls} = \frac{1}{2} \cdot L_s \cdot I_L^2$$

$$E_{Cs} = \frac{1}{2} \cdot C_s \cdot V_{cc}^2$$

where Ls represents the total sum of circuit parasitic inductances, and Cs represents the total sum of circuit parasitic capacitances.

6. A method of designing a power converter according to claim 2, wherein Eon-t and Eoff-t used for calculation of the semiconductor device loss are calculated by the following equations:

$$E_{on-t} = V_{cc} \int_{t_1}^{t_2} i_D \cdot dt + I_L \int_{t_2}^{t_3} v_{DS} \cdot dt - E_{Ls}$$

$$E_{off-t} = I_L \int_{t_4}^{t_5} v_{DS} \cdot dt + V_{cc} \int_{t_5}^{t_6} i_D \cdot dt - E_{Cs} - E_{oss} - E_{diode}$$

where the gate-source voltage vGS, the drain current iD, and the drain-source voltage vDS are calculated by the following equations:

$$v_{GS}(t) = V_{GH} - \frac{V_{GH} - V_{th}}{T_2 - T_3}\left(T_2 \exp\left(-\frac{t}{T_2}\right) - T_3 \exp\left(-\frac{t}{T_3}\right)\right), t_1 < t < t_2$$

$$v_{GS}(t) = \frac{V_{th} + \frac{I_L}{g_m}}{T_2 - T_3}\left(T_2 \exp\left(-\frac{t}{T_2}\right) - T_3 \exp\left(-\frac{t}{T_3}\right)\right), t_5 < t < t_6$$

$$T_2 = \frac{2A}{B + \sqrt{B^2 - 4A}}$$

$$T_3 = \frac{2A}{B - \sqrt{B^2 - 4A}}$$

$$A = R_G \cdot g_m \cdot C_{GD} \cdot L_s$$

$$B = R_G \cdot (C_{GS} + C_{GD}) + L_{s4} \cdot g_m$$

$$R_G = r_G + R_{Gex} + r_{GD}$$

$$i_D(t) = g_m(V_T - v_{GS}(t))$$

$$v_{DS}(t) = V^* - \left(\frac{V_{GH} - (V_T + I_L/g_m)}{R_G \cdot C_{GD}}\right) \cdot t, t_2 < t < t_3$$

$$v_{DS}(t) = V_{on} + \left(\frac{V_T + I_L/g_m}{R_G \cdot C_{GD}}\right) \cdot t, t_4 < t < t_5$$

where the parameters of the switching semiconductor device include:
- CGS: gate-source capacitance
- CGD: gate-drain capacitance
- gm: tansconductance
- Vth: threshold voltage
- rG: gate internal resistance, and the circuit parameters include:
- RG: gate resistance
- RGex: gate external resistance
- rGD: internal resistance of a gate circuit
- Ls4: parasitic inductance of a common wiring of the gate circuit and the main circuit on the source side of the switching device
- VGH: maximum value of the gate-source voltage.

7. A method of designing a power converter according to claim 1, wherein the values of the semiconductor device parameters are determined through measurement of the values of the semiconductor device parameters.

8. A method of designing a power converter according to claim 1, wherein the values of the semiconductor device parameters are determined through calculation of the semiconductor device parameters by means of a semiconductor simulator.

9. A method of designing a power converter according to claim 1, wherein the values of the circuit parasitic parameters are determined through measurement of the values of the circuit parasitic parameters.

10. A method of designing a power converter according to claim 1, wherein the values of the circuit parasitic parameters are determined through calculation of the values of the circuit parasitic parameters by means of an electromagnetic field simulator.

11. A method of designing a power converter according to claim 1, wherein the capacitance of the semiconductor device is represented by a mathematical formula which is a function of the voltage applied to the semiconductor device, the transconductance of the semiconductor device is represented by a mathematical formula which is a function of the current flowing through the semiconductor device or the voltage applied between the gate and the source of the semiconductor device, and the loss of the semiconductor device is calculated by making use of these mathematical formulae.

12. A method of designing a power converter according to claim 1, wherein the relation between the capacitance of the semiconductor device and the voltage applied to the semiconductor device is stored in the form of a data table, the relation between the transconductance of the semiconductor device and the current flowing through the semiconductor device or the voltage applied between the gate and the source of the semiconductor device is stored in the form of a data table, and the loss of the semiconductor device is calculated by making use of these data tables.

13. A method of designing a power converter according to claim 1, wherein the relation between the circuit parameters and the semiconductor device loss is calculated by use of the semiconductor device loss minimizing model formula, results of the calculation are stored in the form of a database as semiconductor device loss design data, and the loss of the semiconductor device is calculated by use of the database.

14. A system for designing a power converter comprising:
means for determining specifications of the power converter, including electrical specifications and a circuit configuration;
means for determining circuit parameter values for realizing the electrical specifications and the circuit configuration;
means for determining a semiconductor device which is used for realizing the determined electrical specifications and circuit configuration;
means for determining an equivalent circuit of the determined semiconductor device;
means for extracting parameter values of the determined semiconductor device equivalent circuit as input data for calculating loss of the semiconductor device;
means for dividing the circuit parameter values into circuit parasitic parameter data and circuit basic parameter data, which serve as input data for calculating the loss of the semiconductor device;
means for supplying the semiconductor device equivalent circuit parameter data, the circuit parasitic parameter data, and the circuit basic parameter data to a semiconductor device loss model so as to calculate the loss of the semiconductor device;
means for determining whether or not a circuit loss optimal value has been achieved in consideration of previously prepared parameter data of components of the power conversion circuit, including control parameter data and filter parameter data;
means for again setting the circuit parasitic parameter values and creating the circuit parasitic parameter data when the circuit loss optimal value has not yet been achieved;
means for outputting, as design data, the semiconductor device loss and the circuit parasitic parameter values at that time when the circuit loss optimal value has been achieved; and
means for designing the power converter by use of the optimized semiconductor device loss and circuit parasitic parameter values.

15. A method of comprehensively designing a power converter including power converter components, the method comprising the steps of:
dividing the design of the power converter into steps corresponding to power conversion circuit components;
quantifying interrelations between the steps;
creating, for the respective quantified interrelations, a circuit design database in which extrinsic parameters are used as parameters;
selecting conversion circuit parameters of the power conversion circuit components from design specifications of the power converter;
inputting the selected conversion circuit parameters of the power conversion circuit components into a database including the circuit design database and a material database;
selecting, from the circuit design database, circuit parasitic parameters which satisfy the specifications of the power converter;
performing structure design which realizes a conversion circuit structure which satisfies the selected circuit parasitic parameters;
performing thermal design which estimates a volume of a cooling unit for maintaining the temperature of the converter components, including a semiconductor device and a passive element, at a predetermined value or lower, by use of the conversion circuit structure obtained by the structure design;
estimating a volume of the power converter from the conversion circuit structure, the cooling unit, and other converter components obtained from the material database; and
estimating an output power density of the power converter from the obtained volume of the power converter and an output power of the power converter determined by the specifications of the power converter.

16. A method of comprehensively designing a power converter according to claim 15, wherein
in the step of dividing the design of the power converter into steps corresponding to power conversion circuit components, the design of the power converter is divided into steps corresponding to power conversion circuit components, such as a step of performing control design, a step of performing design of device parameters, a step of performing main-circuit design, and a step of performing filter design;
in the step of quantifying interrelations between the steps, two ore more steps are selected, and interrelations between the two ore more steps are quantified; and
in the step of creating the circuit design database, respective forms of the quantified interrelations are input to a single database with extrinsic parameters such as circuit parasitic inductance and circuit parasitic capacitance of the main circuit being used as parameters, the respective forms input to the database are arranged around the extrinsic parameters to thereby form the circuit design database, and the power conversion circuit is designed by making use of the converter design database.

17. A method of comprehensively designing a power converter according to claim 16, comprising the steps of:
selecting a circuit parasitic inductance and a circuit parasitic capacitance which are circuit parasitic parameters which satisfy the specifications of the power converter, by use of the circuit design database;
designing a conversion circuit structure in the structure design;
performing electromagnetic analysis for the designed conversion circuit structure to thereby calculate the circuit parasitic inductance and the circuit parasitic capacitance of the designed conversion circuit structure; and
instructing to again perform the structure design if the calculated parasitic inductance and parasitic capacitance do not satisfy designated values and the target is not achieved.

18. A method of comprehensively designing a power converter according to claim 17, comprising the steps of:
performing conversion circuit thermal design for the conversion circuit structure which satisfies the designated parasitic parameters, when the designated structure design and conversion circuit electromagnetic design are attained, to thereby calculate operating temperatures of the converter components, such as a semiconductor device and a filter; and instructing to again perform the conversion circuit thermal design if the calculated operating temperatures do not fall within respective predetermined allowable ranges.

19. A method of comprehensively designing a power converter according to claim 18, comprising the steps of:
calculating, when the operating temperatures fall within the respective predetermined allowable ranges, volumes of a cooling section and a filter section of the converter, which volumes realize the operating temperatures; and
instructing to again perform the conversion circuit thermal design and the volume calculation if the target value is not attained.

20. A method of comprehensively designing a power converter according to claim 19, comprising the steps of:
calculating, when designated conditions on the volumes of the cooling section and the filter section are satisfied, an output power density of the power converter by adding, to the volumes of the cooling section and the filter section, volumes of other components of the power conversion circuit; and
instructing to again perform the calculation of the output power density if the target value is not attained.

21. A method of comprehensively designing a power converter according to claim 16, comprising the steps of:
separately extracting, in the device/main-circuit design for creation of the circuit design database, true parameters of the semiconductor device and extrinsic parameters which appear as a parasitic impedance and a parasitic capacitance on a wiring structure when the electric circuit is realized; and
creating a database for providing a semiconductor device loss and a semiconductor device over-voltage, which serves as target specifications, for an arbitrary extrinsic parameter.

22. A method of comprehensively designing a power converter according to claim 21, wherein in the device/main-circuit design, calculation of true energy for calculation of the semiconductor device loss is performed in such a manner that the capacitance/voltage characteristic of the semiconductor device is measured experimentally, an energy accumulated in the capacitance when the circuit is operated is calculated by use of the result of the measurement, and a true energy generated as a result of charging and discharging of the accumulated energy is experimentally calculated.

23. A method of comprehensively designing a power converter according to claim 21, wherein in the device/main-circuit design, calculation of extrinsic energy for calculation of the semiconductor device loss is performed in such a manner that the relation between the semiconductor device loss and an extrinsic parameter which determines the semiconductor device loss is measured experimentally, the obtained experimental relation is described in the form of an approximation formula, and the extrinsic energy is calculated by use of the approximation formula.

24. A method of comprehensively designing a power converter according to claim 21, wherein in the device/main-circuit design, calculation of true energy for calculation of the semiconductor device loss is performed in such a manner that the relation between the semiconductor device loss and a true parameter which determines the semiconductor device loss is measured by making use of a semiconductor device simulator, the parameter obtained from the semiconductor device simulator is applied to an experimental approximation formula, and a true energy is calculated by making use of the experimental approximation formula.

25. A method of comprehensively designing a power converter according to claim 21, wherein in the device/main-circuit design, calculation of extrinsic energy for calculation of the semiconductor device loss is performed in such a manner that the relation between the semiconductor device loss and an extrinsic parameter which determines the semiconductor device loss is measured by making use of a semiconductor device simulator, the parameter obtained from the semiconductor device simulator is applied to an experimental approximation formula, and an extrinsic energy is calculated by making use of the experimental approximation formula.

26. A method of comprehensively designing a power converter according to claim 21, wherein in the device/main-circuit design, the calculation of true energy and the calculation of extrinsic energy for calculation of the semiconductor device loss are performed in such a manner that the true energy and the extrinsic energy are calculated by use of a true loss calculation formula and an extrinsic loss calculation formula, which are obtained through theoretical calculation.

27. A method of comprehensively designing a power converter according to claim 16, wherein the step of quantifying the interrelations of the device/main-circuit design parameters and the control/driver design parameters in the creation of the circuit design database includes steps of determining a switching frequency, a switching speed, and a switching pattern in the control/driver design; and
the device/main-circuit design includes a step of separating and determining true parameters which describe the semiconductor device and extrinsic parameters which are parasitic on a wiring structure, wherein semiconductor device loss and semiconductor device over-voltage are calculated experimentally or theoretically and are input to the design database.

28. A method of comprehensively designing a power converter according to claim 16, wherein the step of quantifying the interrelations of the device/main-circuit design parameters and the filter design parameters includes a step of separating and determining true parameters which describe the semiconductor device and extrinsic parameters which are parasitic on a wiring structure; and
a step of separating and determining true parameters which describe the characteristics of a magnetic material and extrinsic parameters stemming from the wiring structure in the filter design, wherein the semiconductor device over-voltage and filter frequency characteristics are calculated experimentally or theoretically, converter output harmonics are calculated, and are input to the design database.

29. A method of comprehensively designing a power converter according to claim 16, wherein the step of quantifying the interrelations of the control/driver design parameters and the filter design parameters includes steps of determining a switching frequency, a switching speed, and a switching pattern in the control/driver design; and
a step of separating and determining true parameters which describe the characteristics of a magnetic material and extrinsic parameters stemming from the wiring structure in the filter design, wherein filter loss is calculated experimentally or theoretically, and is input to the design database.

30. A system for comprehensively designing a power converter including power converter components, the system comprising:
means for dividing the design of the power converter into steps corresponding to power conversion circuit components;
means for quantifying interrelations between the steps;

means for creating, for the respective quantified interrelations, a circuit design database in which extrinsic parameters are used as parameters;

means for selecting conversion circuit parameters of the power conversion circuit components from design specifications of the power converter;

means for inputting the selected conversion circuit parameters of the power conversion circuit components into a database including the circuit design database and a material database;

means for selecting, from the circuit design database, circuit parasitic parameters which satisfy the specifications of the power converter;

means for performing structure design which realizes a conversion circuit structure which satisfies the selected circuit parasitic parameters;

means for performing thermal design which estimates a volume of a cooling unit for maintaining the temperature of the converter components, including a semiconductor device and a passive element, at a predetermined value or lower, by use of the conversion circuit structure obtained by the structure design;

means for estimating a volume of the power converter from the conversion circuit structure, the cooling unit, and other converter components obtained from the material database; and means for estimating an output power density of the power converter from the obtained volume of the power converter and an output power of the power converter determined by the specifications of the power converter.

* * * * *